(12) United States Patent
Bae et al.

(10) Patent No.: US 12,073,793 B2
(45) Date of Patent: Aug. 27, 2024

(54) DISPLAY DEVICE

(71) Applicant: Samsung Display Co., Ltd., Yongin-Si (KR)

(72) Inventors: Woomi Bae, Daegu (KR); Hae-Kwan Seo, Hwaseong-si (KR); Youngha Sohn, Seongnam-si (KR); Seungjae Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/511,931

(22) Filed: Oct. 27, 2021

(65) Prior Publication Data
US 2022/0139326 A1 May 5, 2022

(30) Foreign Application Priority Data
Nov. 3, 2020 (KR) .......................... 10-2020-0145498

(51) Int. Cl.
G09G 3/3233 (2016.01)
G09G 3/3266 (2016.01)

(52) U.S. Cl.
CPC ....... G09G 3/3266 (2013.01); *G09G 2310/08* (2013.01); *G09G 2320/0233* (2013.01); *G09G 2360/12* (2013.01)

(58) Field of Classification Search
CPC ............. G09G 2360/12; G09G 3/3233; G09G 3/3677; G09G 2300/0861; G09G 2310/0262; G09G 2310/0286; G09G 2310/04; G09G 2320/0686; G09G 2340/0435; G09G 2380/02; G09G 3/3208; G09G 2320/02; G09G 3/3225; G09G 3/3275; G09G 2340/04; G09G 3/3266; G09G 2310/08; G09G 2320/0233; G09G 2300/0819; G09G 2300/0842; G09G 2310/0251; G11C 19/28

See application file for complete search history.

(56) References Cited

U.S. PATENT DOCUMENTS 8,704,748 B2   4/2014  Kim et al.
8,957,883 B2 *  2/2015  Maruyama ........... G09G 3/3666
                                                         345/208

(Continued)

FOREIGN PATENT DOCUMENTS

EP   3933821 A1   1/2022
KR  101415562 B1  7/2014

(Continued)

*Primary Examiner* — Lunyi Lao
*Assistant Examiner* — Jarurat Suteerawongsa
(74) *Attorney, Agent, or Firm* — CANTOR COLBURN LLP

(57) ABSTRACT

A display device includes a display panel which displays an image during a plurality of driving frames, a panel driver which drives the display panel, and a driving controller which controls a driving operation of the panel driver. The driving controller divides the display panel into a first display area and a second display area based on an image signal. Each of the plurality of driving frames includes a full frame in which the first display area and the second display area are driven, and a plurality of partial frames in which only the first display area is driven. A number of the plurality of partial frames included in each of the plurality of driving frames is changed.

25 Claims, 20 Drawing Sheets

(56) References Cited

U.S. PATENT DOCUMENTS

| | | | |
|---|---|---|---|
| 10,424,255 B2* | 9/2019 | Pyo | G09G 3/3233 |
| 10,909,935 B2 | 2/2021 | Koo et al. | |
| 2003/0025656 A1* | 2/2003 | Kimura | G09G 3/3258 |
| | | | 345/82 |
| 2003/0174153 A1* | 9/2003 | Koyama | G09G 3/3275 |
| | | | 345/690 |
| 2014/0354624 A1* | 12/2014 | Chaji | G09G 3/3225 |
| | | | 345/212 |
| 2015/0049122 A1* | 2/2015 | Buckley | G09G 3/2003 |
| | | | 345/690 |
| 2015/0243203 A1* | 8/2015 | Kim | G09G 3/3291 |
| | | | 345/212 |
| 2016/0042707 A1* | 2/2016 | Wang | G09G 3/3266 |
| | | | 345/214 |
| 2016/0042708 A1* | 2/2016 | Wang | G09G 3/3611 |
| | | | 345/214 |
| 2016/0111055 A1* | 4/2016 | Na | G09G 3/3666 |
| | | | 345/94 |
| 2016/0351160 A1* | 12/2016 | In | G09G 3/3225 |
| 2018/0090096 A1* | 3/2018 | Post | G09G 3/3651 |
| 2018/0374416 A1 | 12/2018 | Hou et al. | |
| 2019/0043406 A1* | 2/2019 | Ansari | G09G 3/20 |
| 2019/0156785 A1* | 5/2019 | Marchya | G09G 3/2096 |
| 2019/0206329 A1* | 7/2019 | Lee | G09G 3/3677 |
| 2020/0152109 A1 | 5/2020 | Jung et al. | |
| 2020/0388228 A1* | 12/2020 | Oh | G09G 5/373 |
| 2021/0407352 A1 | 12/2021 | Seo et al. | |
| 2021/0407424 A1* | 12/2021 | Long | G09G 3/3266 |

FOREIGN PATENT DOCUMENTS

| | | |
|---|---|---|
| KR | 101556789 B1 | 10/2015 |
| KR | 1020160141132 A | 12/2016 |
| KR | 1020170049735 A | 5/2017 |
| KR | 1020190083393 A | 7/2019 |
| KR | 1020200022557 A | 3/2020 |
| KR | 1020200056090 A | 5/2020 |
| KR | 1020220001555 A | 1/2022 |

* cited by examiner

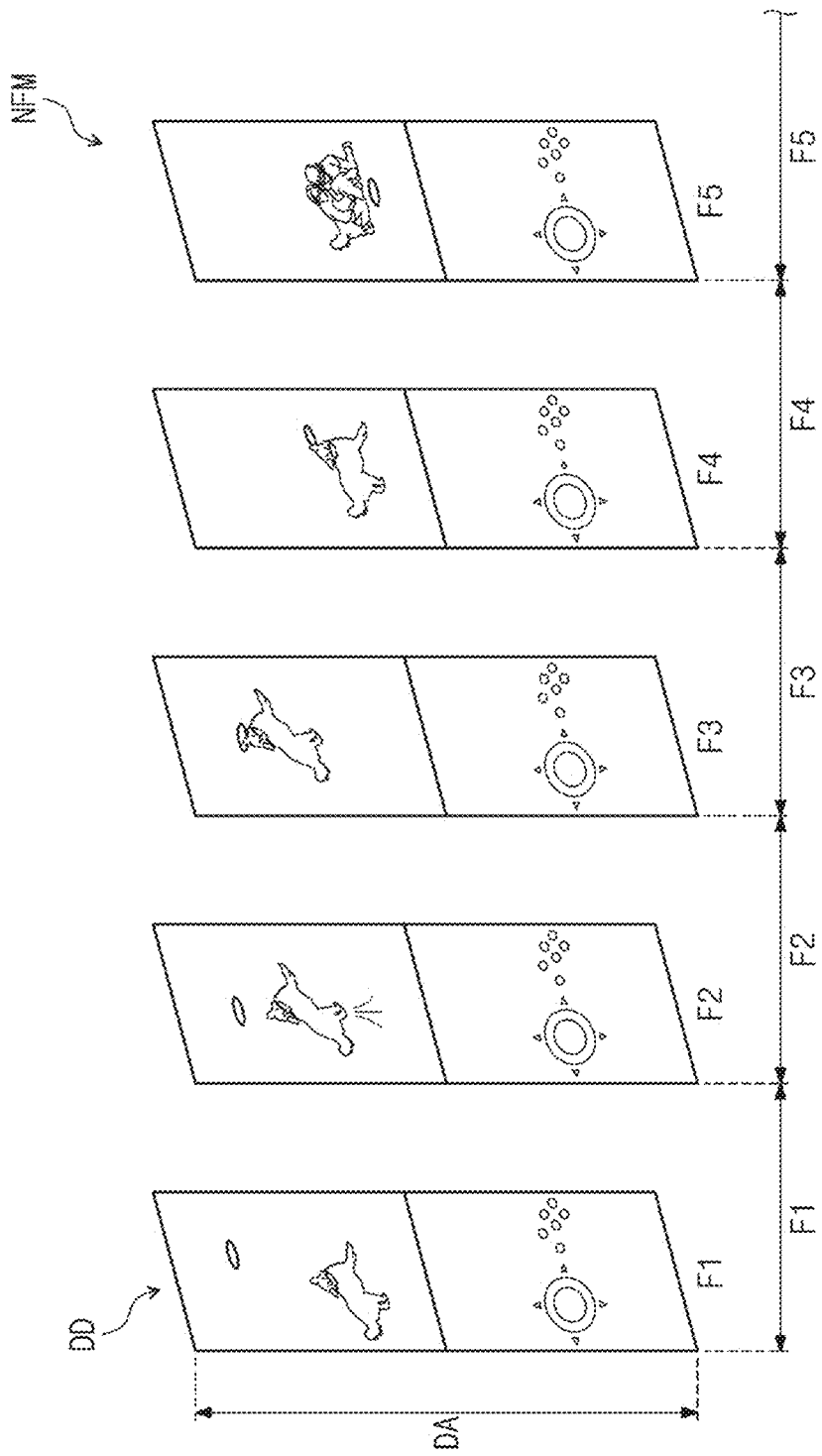

DISPLAY DEVICE

This application claims priority to Korean Patent Application No. 10-2020-0145498, filed on Nov. 3, 2020, and all the benefits accruing therefrom under 35 U.S.C. § 119, the content of which in its entirety is herein incorporated by reference.

BACKGROUND

1. Field

Embodiments of the disclosure described herein relate to a display device, and more particularly, relate to a display device capable of driving at a high speed or frequency.

2. Description of the Related Art

An organic light emitting display device, among various types of display device, displays an image by using an organic light emitting diode that generates light by the recombination of electrons and holes. Such an organic light emitting display device may have a fast response speed and be driven with low power consumption.

The organic light emitting display device may include pixels connected to data lines and scan lines. In general, each of the pixels includes the organic light emitting diode and a circuit unit that controls the amount of current flowing through the organic light emitting diode. The circuit unit controls the amount of current flowing from a first driving voltage to a second driving voltage via the organic light emitting diode in response to a data signal, such that the light having a predetermined luminance corresponding to the amount of current flowing through the organic light emitting diode is emitted therefrom.

When a video is displayed on a display device, the display quality of the video may be improved as an operating frequency increases.

SUMMARY

Embodiments of the disclosure provide a display device capable of improving display quality when the display device operates at a high speed or frequency.

According to an embodiment, a display device includes a display panel which displays an image during a plurality of driving frames, a panel driver which drives the display panel, and a driving controller which controls a driving operation of the panel driver.

In such an embodiment, the driving controller divides the display panel into a first display area and a second display area based on an image signal. In such an embodiment, each of the plurality of driving frames includes a full frame in which the first display area and the second display area are driven, and a plurality of partial frames in which only the first display area is driven. In such an embodiment, a number of the plurality of partial frames included in each of the plurality of driving frames is changed.

According to an embodiment, a display device includes a display panel which displays an image, a panel driver which drives the display panel, and a driving controller which controls a driving operation of the panel driver.

In such an embodiment, the driving controller divides the display panel into a first display area and a second display area based on an image signal. In such an embodiment, the driving controller provides the panel driver with a full data signal corresponding to the first display area and the second display area during a full frame, and the driving controller provides the panel driver with a partial data signal corresponding to the first display area during each of a plurality of partial frames following the full frame. In such an embodiment, a number of the plurality of partial frames interposed between two adjacent full frames is changed.

BRIEF DESCRIPTION OF THE DRAWINGS

The above and other features of the disclosure will become apparent by describing in detail embodiments thereof with reference to the accompanying drawings, in which:

FIG. 4B is a diagram illustrating a frame in which frame data illustrated in FIG. 4A is displayed;

DETAILED DESCRIPTION

Figure 1A:
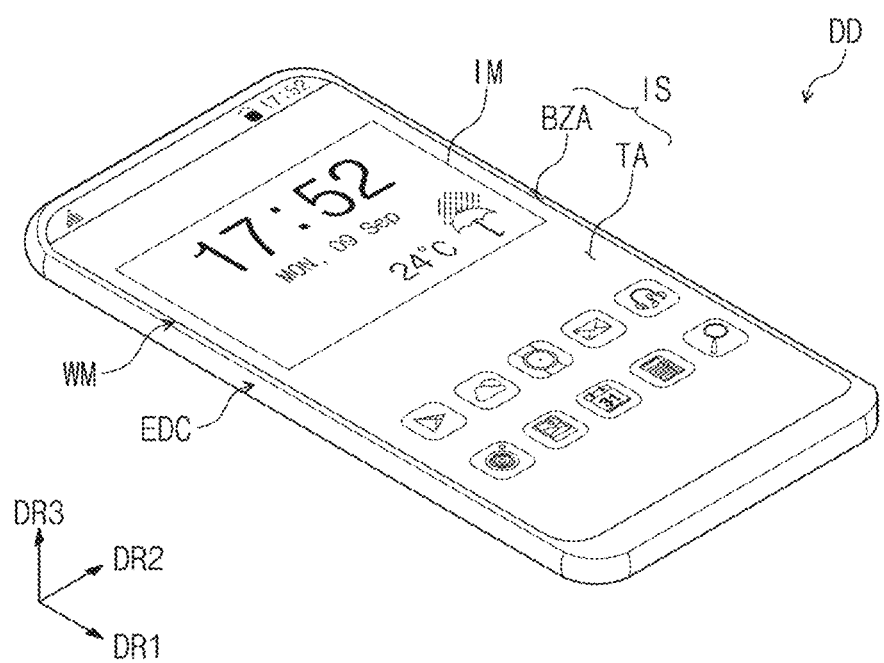
FIG. 1A is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, when a component (or area, layer, portion, or the like) is described as being "on", "connected to", or "coupled to" another component, it means that the component may be directly positioned/connected/coupled on the other component or an intervening element may be present therebetween.

The same reference numerals refer to like components. Also, in drawings, thicknesses, proportions, and dimensions of components may be exaggerated to describe the technical features effectively.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Furthermore, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical terms and scientific terms) used in this specification have the same meaning as commonly understood by those skilled in the art to which the disclosure belongs. Furthermore, terms such as terms defined in commonly used dictionaries should be interpreted as having a meaning consistent with the meaning in the context of the related technology, and is explicitly defined herein unless interpreted in ideal or overly formal meanings.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to accompanying drawings.

Figure 1B:
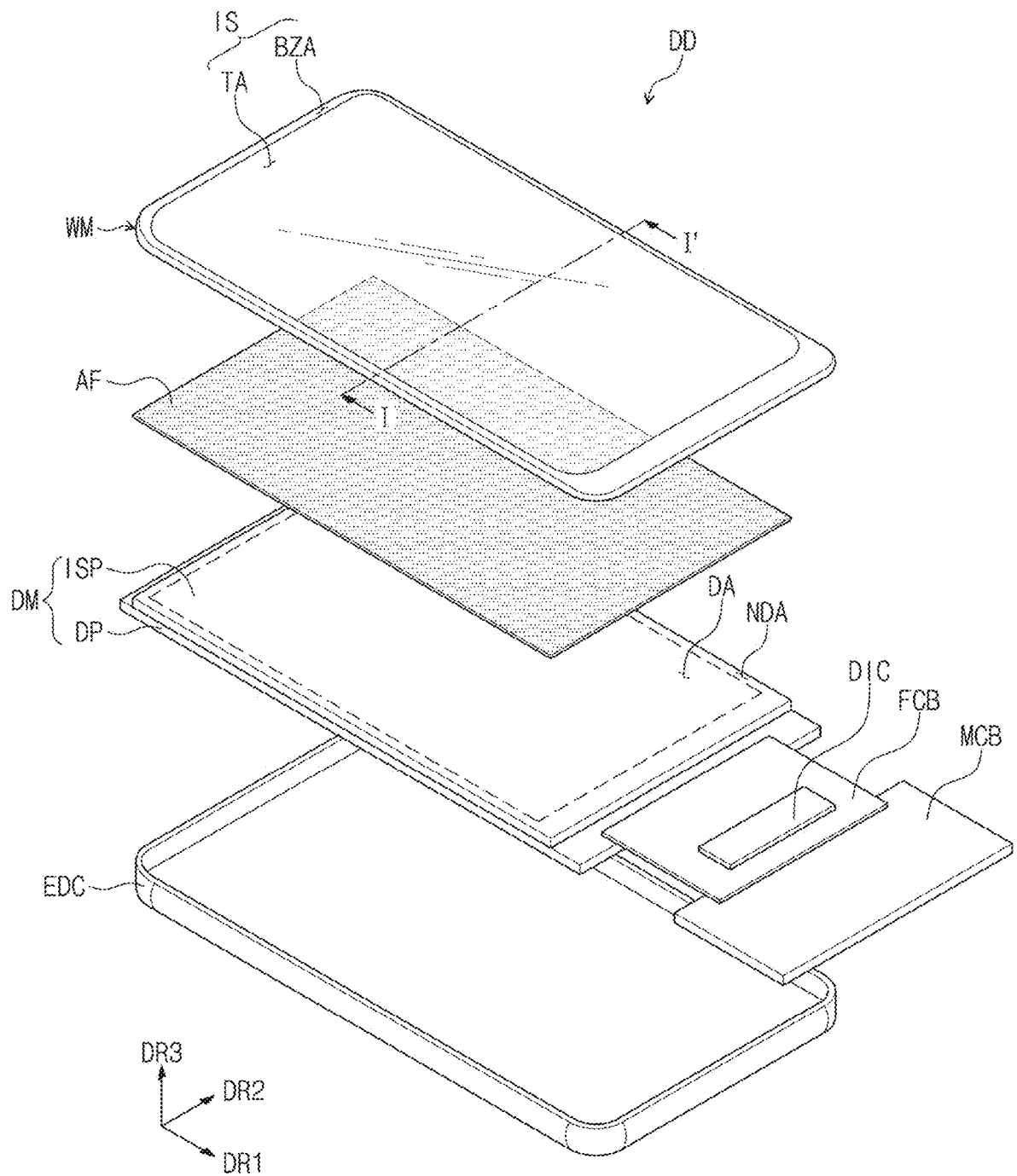
FIG. 1B is an exploded perspective view of a display device according to an embodiment of the disclosure.
Figure 1C:
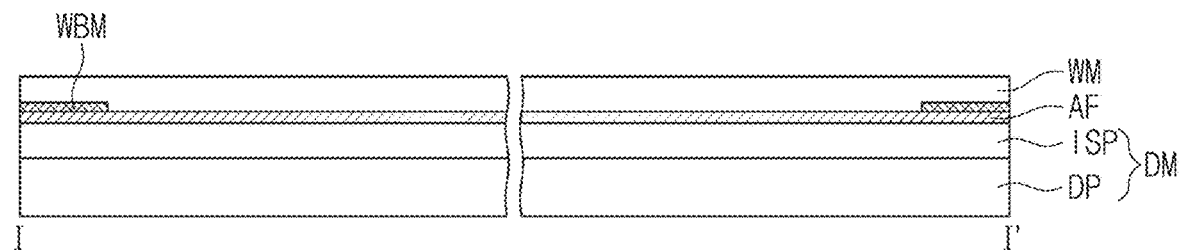
FIGS. 1C and 1D are cross-sectional views of a display device taken along line I-I' illustrated in FIG. 1B.
Figure 1D:
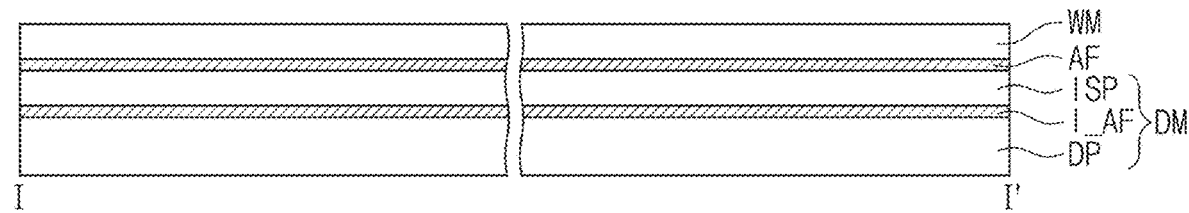

FIG. 1A is a perspective view of a display device according to an embodiment of the disclosure. FIG. 1B is an exploded perspective view of a display device according to an embodiment of the disclosure. FIGS. 1C and 1D are cross-sectional views of a display device taken along line I-I' illustrated in FIG. 1B.

Referring to FIGS. 1A and 1B, a display device DD may be a device activated depending on an electrical signal. The display device DD may be applied to an electronic device such as a smart watch, a tablet personal computer ("PC"), a notebook/laptop computer, a PC, a smart television, or the like.

In an embodiment, the display device DD may display an image IM on a display surface IS, which is parallel to each of a first direction DR1 and a second direction DR2, in a third direction DR3. The display surface IS on which the image IM is displayed may correspond to a front surface of the display device DD. The image IM may include not only static images but also moving images or videos.

In an embodiment, the front surface (or an upper surface) and a rear surface (or a lower surface) of each member are defined with respect to a direction in which the image IM is displayed. The front surface and the rear surface may be opposed in the third direction DR3, and the normal direction of each of the front surface and the rear surface may be parallel to the third direction DR3.

The separation distance between the front surface and the rear surface in the third direction DR3 may correspond to the thickness of the display device DD in the third direction DR3. Herein, directions that the first, second, and third directions DR1, DR2, and DR3 indicate may be relative and may be changed to different directions.

In an embodiment, the display device DD may detect an external input applied from an outside. The external input may include various types of inputs provided from the outside of the display device DD. In one embodiment, for example, the external input may include an external input (e.g., hovering) applied in a state where a part of a body such as a user's hand is close to the display device or is spaced from the display device as much as a predetermined distance, as well as a contact by the part of the body. In an embodiment, the external input may have various forms such as force, pressure, temperature, light, and the like.

The display surface IS of the display device DD may be divided into a transparent area TA and a bezel area BZA. The image IM may be displayed in the transparent area TA. A user visually perceives the image IM through the transparent area TA. In an embodiment, as shown in FIG. 1A, the transparent area TA may be in a rectangular shape with rounded vertices. However, the transparent area TA according to the disclosure is not limited thereto. In one embodiment, for example, the transparent area TA may have one of other various shapes, but not being particularly limited.

The bezel area BZA is adjacent to the transparent area TA. The bezel area BZA may have a predetermined color. The bezel area BZA may surround the transparent area TA. Accordingly, the shape of the transparent area TA may be defined substantially by the bezel area BZA. However, the bezel area BZA is not limited thereto. Alternatively, the bezel area BZA may be disposed adjacent to only one side of the transparent area TA or may be omitted. Embodiment of The display device DD according to the disclosure may be variously modified, without being limited to any one embodiment.

In an embodiment, as illustrated in FIG. 1B, the display device DD may include a display module DM and a window WM disposed on the display module DM. The display module DM may include a display panel DP and an input sensor ISP.

An embodiment of the display panel DP according to the disclosure may be a light emitting display panel, but not being particularly limited. In one embodiment, for example, the display panel DP may be an organic light emitting display panel or a quantum dot light emitting display panel. The light emitting layer of the organic light emitting display panel may include an organic light emitting material. The light emitting layer of the quantum dot light emitting display panel may include a quantum dot, a quantum rod, and the like. Hereinafter, for convenience of description, embodiments where the display panel DP is an organic light emitting display panel will be described in detail.

Referring to FIG. 1C, in an embodiment, the input sensor ISP may be disposed directly on the display panel DP. According to an embodiment of the disclosure, the input sensor ISP may be provided or formed on the display panel DP by continuous processes. In such an embodiment, where the input sensor ISP is disposed directly on the display panel DP, an adhesive film is not interposed between the input sensor ISP and the display panel DP. In an alternative embodiment, as illustrated in FIG. 1D, an inner adhesive film I_AF may be interposed between the input sensor ISP and the display panel DP. In such an embodiment, the input sensor ISP is not manufactured by continuous processes together with the display panel DP. In such an embodiment, the input sensor ISP may be manufactured through a process different from a process of manufacturing the display panel DP and may then be attached or fixed to the upper surface of the display panel DP by the inner adhesive film I_AF.

The display panel DP generates an image, and the input sensor ISP obtains coordinate information of the external input.

The window WM may include or be formed of a transparent material capable of projecting an image. In one embodiment, for example, the window WM may include or be formed of glass, sapphire, plastic, or the like. In an embodiment, as shown in FIGS. 1C and 1D, the window WM may have a single layer structure, but not being limited thereto. In one alternative embodiment, for example, the window WM may have a multilayer structure including a plurality of layers. In an embodiment, although not illustrated, the bezel area BZA of the above-described display device DD may be substantially provided as an area in which a material including a predetermined color is printed in one area of the window WM. According to an embodiment of the disclosure, the window WM may include a light-shielding pattern WBM to define the bezel area BZA. In one embodiment, for example, the light-shielding pattern WBM may be formed by a coating method, as a colored organic film.

The window WM may be coupled to the display module DM via an adhesive film AF. According to an embodiment of the disclosure, the adhesive film AF may include an optically clear adhesive film ("OCA"). However, the adhesive film AF is not limited thereto. Alternatively, the adhesive film AF may include a general adhesive or pressure sensitive adhesive. In one embodiment, for example, the adhesive film AF may include optically clear resin ("OCR") or pressure sensitive adhesive ("PSA") film.

An anti-reflection layer (not shown) may be further interposed between the window WM and the display module DM. The anti-reflection layer reduces the reflectance of external light incident from the upper surface of the window WM. In an embodiment, the anti-reflection layer may include a retarder and a polarizer. The retarder may have a film type or a liquid crystal coating type, and may include a $\lambda/2$ retarder and/or a $\lambda/4$ retarder. The polarizer may also have a film type or a liquid crystal coating type. The film type may include a stretched synthetic resin film, and the liquid crystal coating type may include liquid crystals arranged in a predetermined array. The retarder and the polarizer may be implemented as or collectively define one polarizing film.

The display module DM may display an image based on an electrical signal and may transmit/receive information about an external input. The display module DM may be defined as a display area DA and a non-display area NDA. The display area DA may be defined as an area of projecting the image provided from the display module DM.

The non-display area NDA is adjacent to the display area DA. In one embodiment, for example, the non-display area NDA may surround the display area DA. However, the non-display area NDA is not limited thereto. In one alternative embodiment, for example, the non-display area NDA may have one of other various shapes, without being particularly limited. According to an embodiment, the display area DA of the display module DM may correspond to at least part of the transparent area TA.

The display module DM may further include a main circuit board MCB, a flexible circuit film FCB, and a driving chip DIC. The main circuit board MCB is connected to the flexible circuit film FCB and may be electrically connected to the display panel DP. The main circuit board MCB may include a plurality of driving elements. The plurality of driving elements may include a circuit unit driving the display panel DP. The flexible circuit film FCB is connected to the display panel DP to electrically connect the display panel DP to the main circuit board MCB. The driving chip DIC may be disposed or mounted on the flexible circuit film FCB.

The driving chip DIC may include driving elements for driving pixels of the display panel DP, such as a data driving circuit. In an embodiment, a single flexible circuit film FCB may be included in the display device DD, as shown in FIG. 1B, but not being limited thereto. In one alternative embodiment, for example, the plurality of flexible circuit films FCB may be connected to the display panel DP. FIG. 1B illustrates an embodiment in which the driving chip DIC is mounted on the flexible circuit film FCB, but the disclosure is not limited thereto. In one alternative embodiment, for example, the driving chip DIC may be mounted directly on the display panel DP. In such an embodiment, a portion on which the driving chip DIC of the display panel DP is mounted may be bent to be disposed on the rear surface of the display module DM.

The input sensor ISP may be electrically connected to the main circuit board MCB through the flexible circuit film FCB. However, embodiments of the disclosure are not limited thereto. Alternatively, the display module DM may further include a separate flexible circuit film that electrically connects the input sensor ISP to the main circuit board MCB.

The display device DD further includes an external case EDC for accommodating the display module DM. The external case EDC may be coupled to the window WM to define the exterior appearance of the display device DD. The external case EDC protects the elements included in the external case EDC by absorbing the shock applied from the outside and preventing foreign objects/moisture from being penetrated therethrough to the display module DM. In an embodiment of the disclosure, the external case EDC may be provided in an assembly form or a form in which a plurality of storage members or parts are coupled to one another.

In an embodiment, the display device DD may further include an electronic module including various functional modules for operating the display module DM, a power supply module for supplying power required for overall operations of the display device DD, a bracket, which is coupled to the display module DM and/or the external case EDC and which is used to divide the internal space of the display device DD, and the like.

Figure 2A:
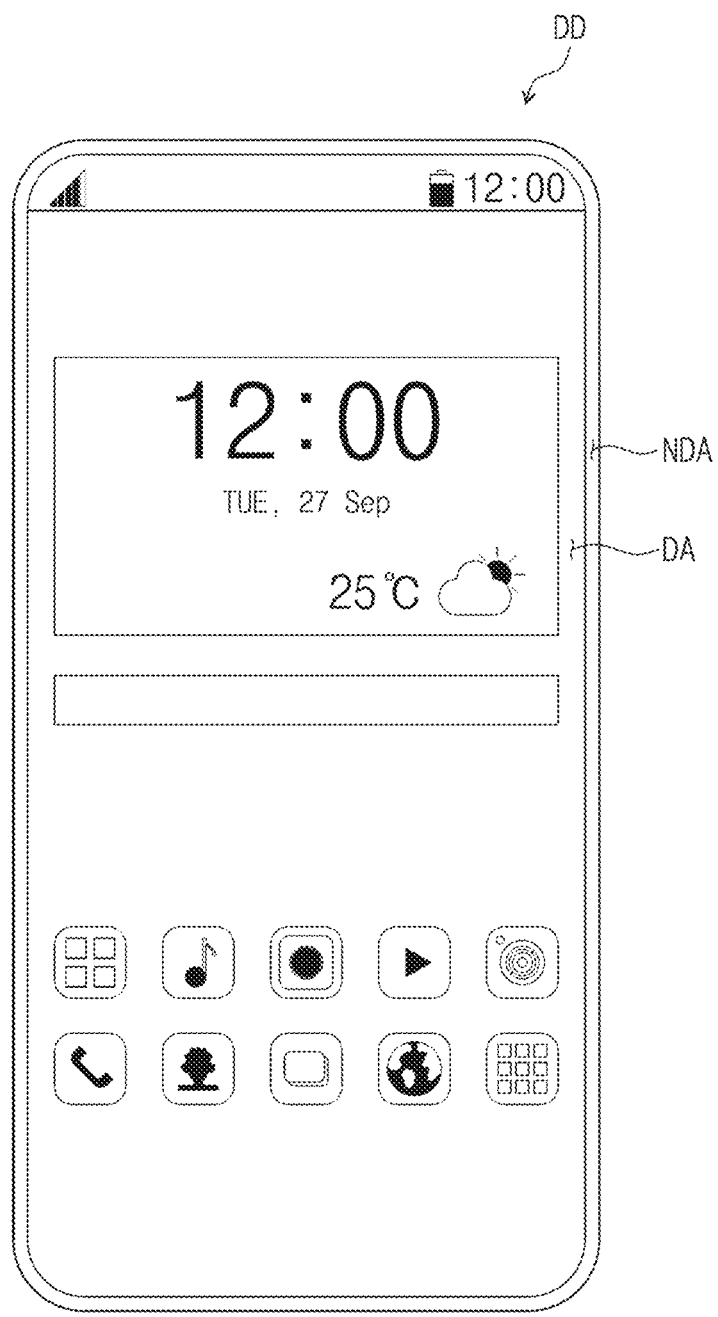
FIG. 2A is a plan view illustrating a screen of a display device operating in a normal frequency mode according to an embodiment of the disclosure.
Figure 2B:
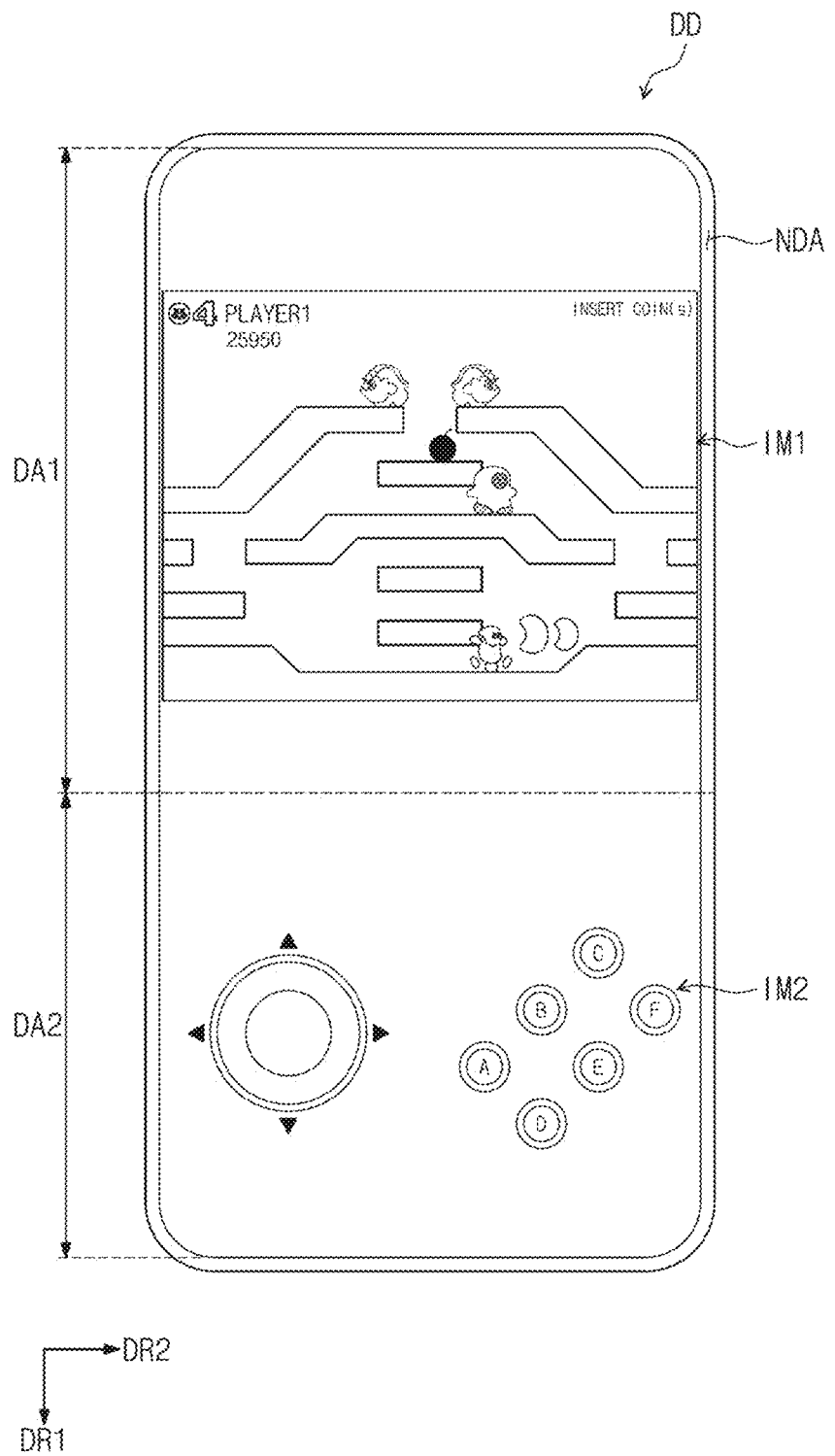
FIG. 2B is a plan view illustrating a screen of a display device operating in a multi-frequency mode according to an embodiment of the disclosure.
Figure 3A:
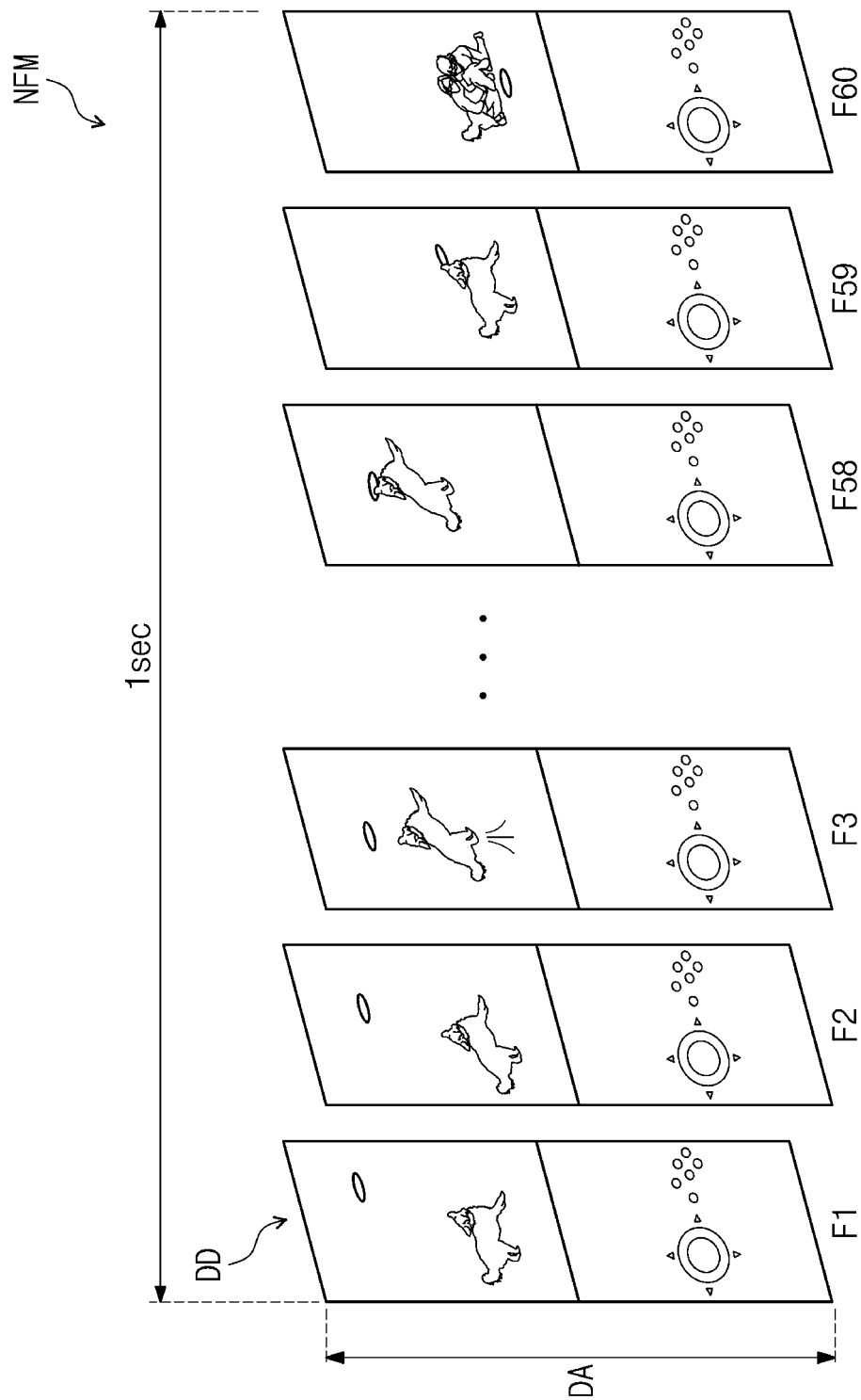
FIG. 3A is a diagram illustrating an operation of a display device in a normal frequency mode according to an embodiment of the disclosure.
Figure 3B:
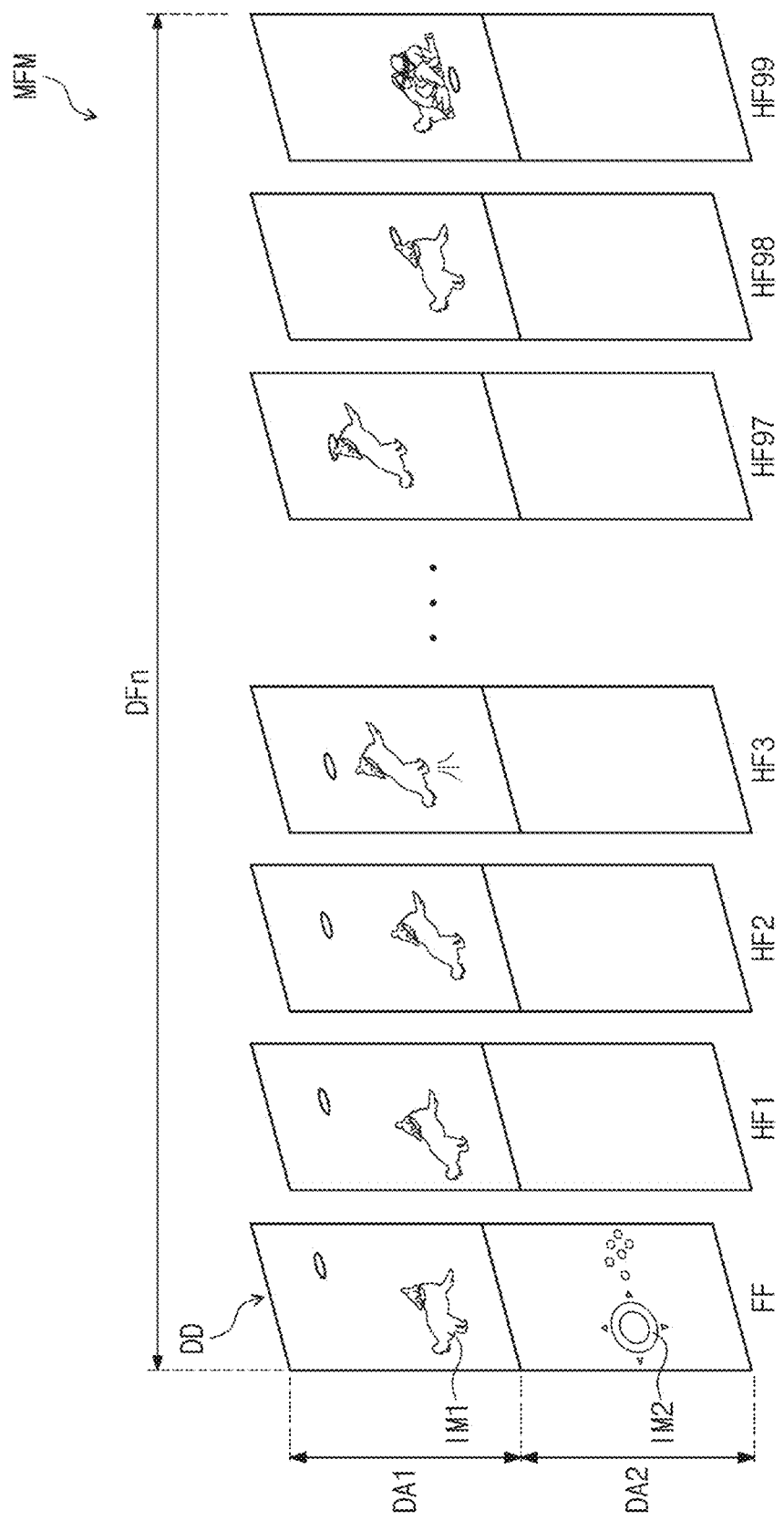
FIGS. 3B and 3C are diagrams illustrating an operation of a display device in a multi-frequency mode according to an embodiment of the disclosure.
Figure 3C:
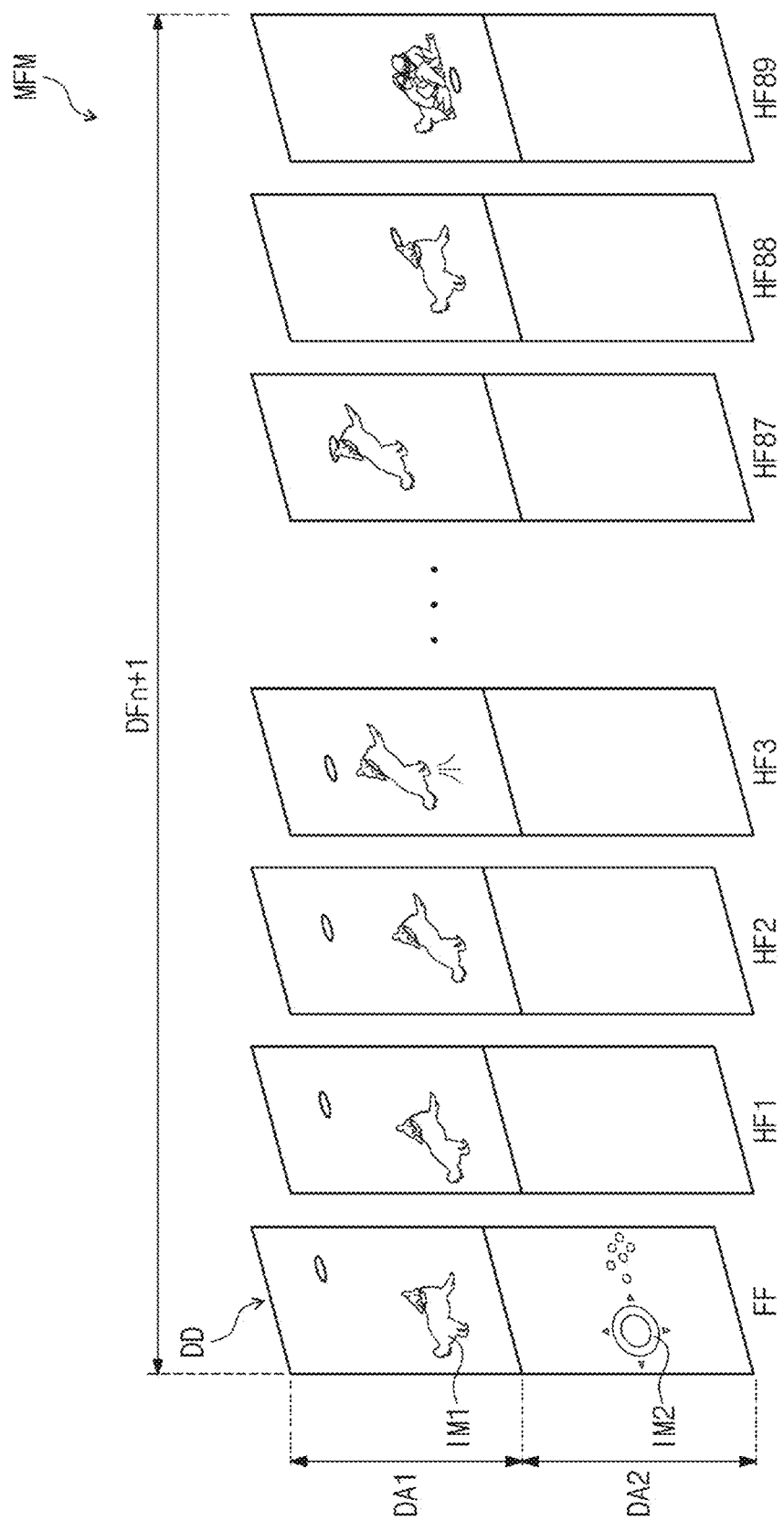

FIG. 2A is a plan view illustrating a screen of a display device operating in a normal frequency mode. FIG. 2B is a plan view illustrating a screen of a display device operating in a multi-frequency mode. FIG. 3A is a diagram illustrating an operation of a display device in a normal frequency mode. FIGS. 3B and 3C are diagrams illustrating an operation of a display device in a multi-frequency mode.

Referring to FIGS. 2A to 3C, an embodiment of the display device DD may display an image in a normal frequency mode NFM or a multi-frequency mode MFM. In the normal frequency mode NFM, the display area DA of the display device DD is not divided into a plurality of display areas having different operating frequencies from each other. In such an embodiment, the display area DA in the normal frequency mode NFM may operate in one operating frequency; the operating frequency of the display area DA in the normal frequency mode NFM may be defined as a normal frequency. In one embodiment, for example, the normal frequency may be 60 hertz (Hz). In the normal frequency mode NFM, 60 images respectively corresponding to the first to 60th frames F1 to F60 may be displayed in the display area DA of the display device DD for 1 second (sec).

In the multi-frequency mode MFM, the display area DA of the display device DD is divided into a plurality of display areas having different operating frequencies from each other. According to an embodiment of the disclosure, the display area DA in the multi-frequency mode MFM may include a first display area DA1 and a second display area DA2. The first and second display areas DA1 and DA2 are disposed adjacent to each other in the first direction DR1. The operating frequency of the first display area DA1 may be higher than the normal frequency, and the operating frequency of the second display area DA2 may be lower than the normal frequency. In one embodiment, for example, where the normal frequency is 60 Hz, the operating frequency of the first display area DA1 may be 80 Hz, 90 Hz, 100 Hz, 120 Hz, or the like, and the operating frequency of the second display area DA2 may be 1 Hz, 20 Hz, 30 Hz, 40 Hz, or the like.

According to an embodiment of the disclosure, the first display area DA1 may be an area in which a video (hereinafter referred to as a "first image IM1") is displayed with high-speed driving or high frequency, and the second display area DA2 may be an area in which a still image or a text image (hereinafter referred to as a "second image IM2") having a long change period is displayed with low-speed driving or low frequency. Accordingly, when the still image and video are simultaneously displayed on the screen of the display device DD, the display device DD may be controlled to operate in the multi-frequency mode MFM, and thus, the overall power consumption may be reduced while improving the display quality of video.

Referring to FIGS. 3A to 3C, in the multi-frequency mode MFM, an image may be displayed in the display area DA of the display device DD during a plurality of driving frames. Each of the driving frames may include a full frame FF in which the first display area DA1 and the second display area DA2 are driven, and partial frames in each of which only the first display area DA1 is driven. Each of the partial frames may have a duration shorter than that of the full frame. In an embodiment, the number of the partial frames included in each driving frame may be changed. Herein, each driving frame may be defined as a section from the start time point of a current full frame to the start time point of a next full frame.

In the multi-frequency mode MFM, the n-th driving frame DFn among the driving frames includes the full frame FF and k partial frames. The (n+1)-th driving frame DFn+1 among the driving frames includes the full frame FF and j partial frames. Here, n, k, and j are integers greater than or equal to 1, and k may have a value different from j.

According to an embodiment of the disclosure, during the n-th driving frame DFn, the first display area DA1 may operate at 100 Hz, and the second display area DA2 may operate at 1 Hz. In such an embodiment, the n-th driving frame DFn may have a duration corresponding to 1 sec and may include one full frame FF and 99 partial frames HF1 to HF99. During the n-th driving frame DFn, the 100 first images IM1 corresponding to the one full frame FF and 99 partial frames HF1 to HF99 are displayed in the first display area DA1 of the display device DD, and the one second image IM2 corresponding to the one full frame FF may be displayed in the second display area DA2.

During the (n+1)-th driving frame DFn+1, the first display area DA1 may operate at 90 Hz, and the second display area DA2 may operate at 1 Hz. In such an embodiment, the (n+1)-th driving frame DFn+1 may have a duration corresponding to 1 sec and may include one full frame FF and 89 partial frames HF1 to HF89. During the (n+1)-th driving frame DFn+1, the 90 first images IM1 corresponding to the one full frame FF and 89 partial frames HF1 to HF89 are displayed in the first display area DA1 of the display device DD, and the one second image IM2 corresponding to the one full frame FF may be displayed in the second display area DA2.

For convenience of description, embodiments in which the operating frequency of the second display area DA2 is fixed to 1 Hz in the multi-frequency mode MFM as illustrated in FIGS. 3B and 3C will be described in detail.

However, the operating frequency of the second display area DA2 may be changed, not fixed. In one embodiment, for example, where the operating frequency of the first display area DA1 is changed to 100 Hz or 90 Hz, the operating frequency of the second display area DA2 may also be changed to 20 Hz or 30 Hz.

Figure 4A:
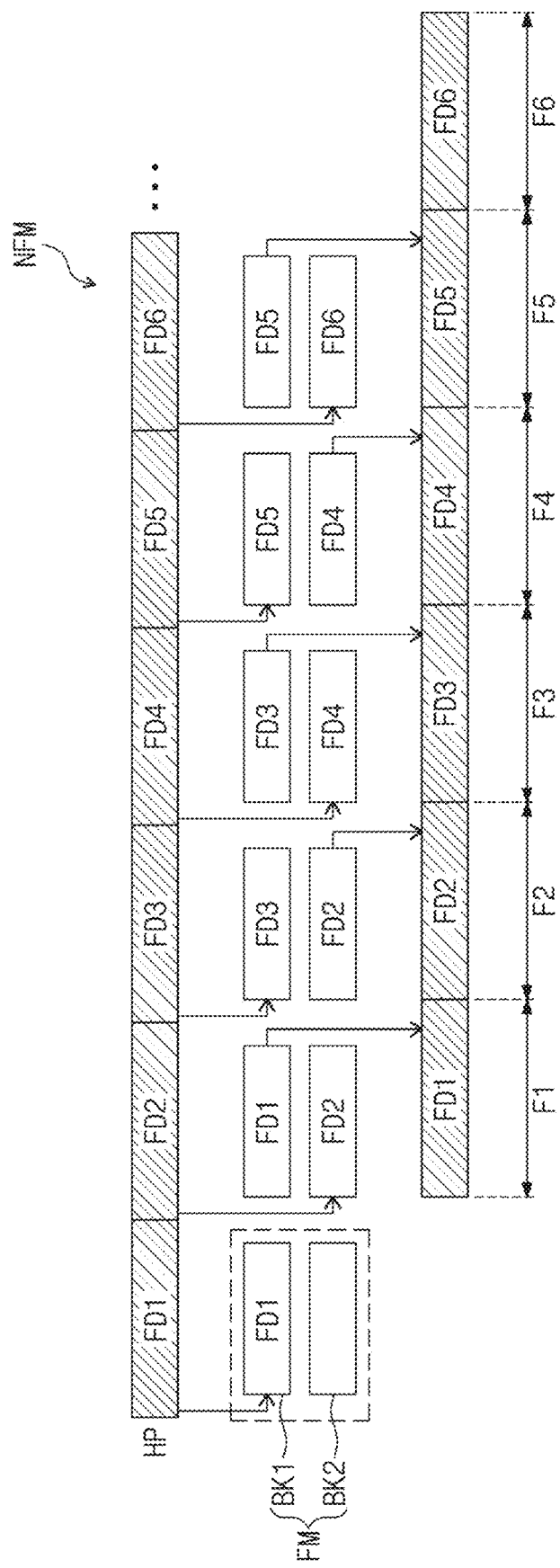
FIG. 4A is a diagram illustrating frame data input to a display device in a normal frequency mode according to an embodiment of the disclosure.
Figure 5A:
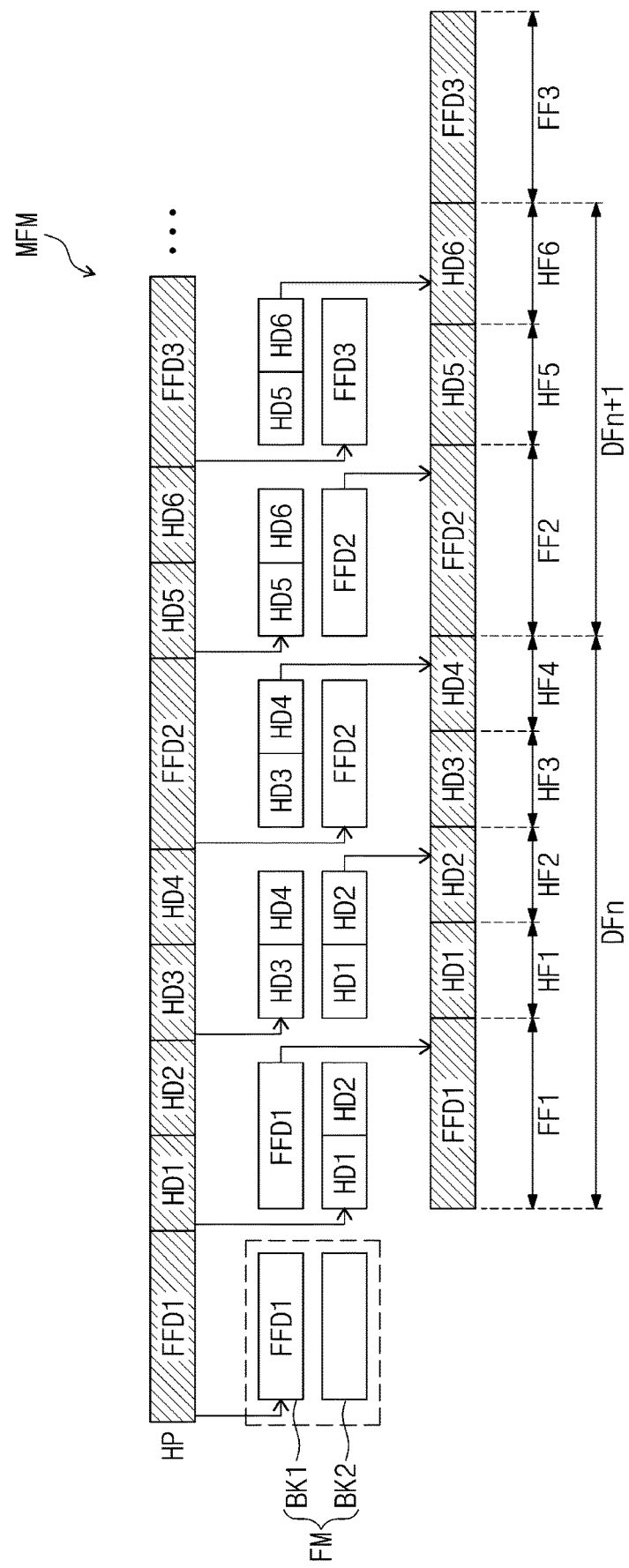
FIG. 5A is a diagram illustrating full frame data and partial frame data input to a display device in a multi-frequency mode according to an embodiment of the disclosure.
Figure 5B:
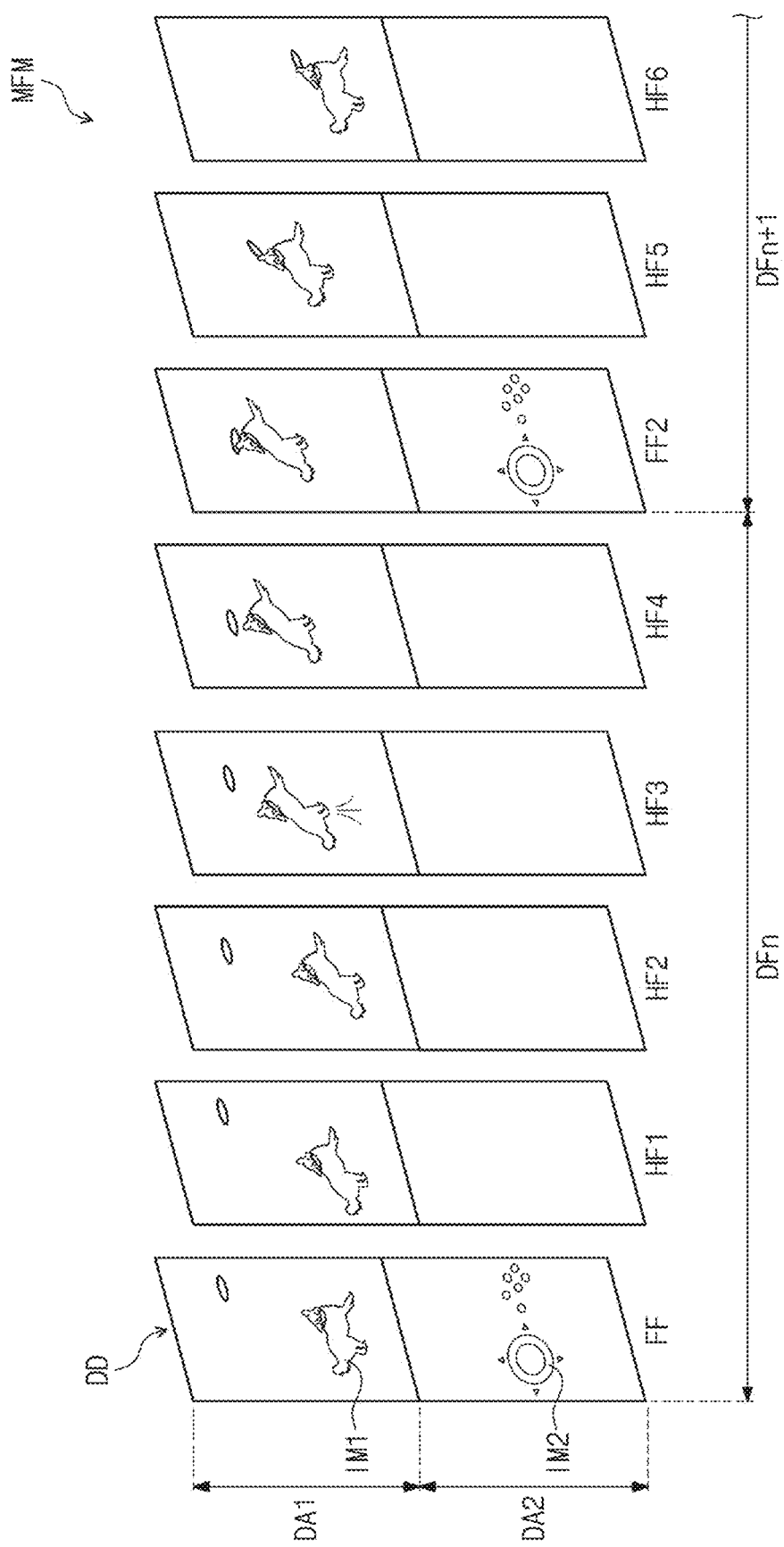
FIG. 5B is a diagram illustrating a full frame in which full frame data is displayed and partial frames in each of which partial frame data is displayed, as shown in FIG. 5A.

FIG. 4A is a diagram illustrating frame data input to a display device in a normal frequency mode according to an embodiment of the disclosure. FIG. 4B is a diagram illustrating a frame in which frame data illustrated in FIG. 4A is displayed. FIG. 5A is a diagram illustrating full frame data and partial frame data input to a display device in a multi-frequency mode according to an embodiment of the disclosure. FIG. 5B is a diagram illustrating a full frame in which full frame data is displayed and partial frames in each of which partial frame data is displayed, as shown in FIG. 5A.

Referring to FIGS. 4A and 4B, the display device DD refers to a device which displays an image, and a host processor HP controls the operation of the display device DD. According to an embodiment of the disclosure, the host processor HP may be a graphic processing unit ("GPU"). The host processor HP may render frame data and may provide the rendered frame data to the display device DD. The frame data sequentially provided from the host processor HP may be stored in a frame memory FM of the display device DD.

The frame memory FM may include a first bank BK1 and a second bank BK2. Each of the first and second banks BK1 and BK2 may have a size capable of storing frame data corresponding to a single frame. When first frame data FD1 among the frame data are stored in the first bank BK1, second frame data FD2 following the first frame data FD1 may be stored in the second bank BK2.

In the normal frequency mode NFM, the display device DD may read the first frame data FD1 stored in the first bank BK1, and may display an image corresponding to the first frame data FD1 in the display area DA during a first frame F1. During the first frame F1, the second frame data FD2 may be written in the second bank BK2 of the display device DD.

The display device DD may read the second frame data FD2 stored in the second bank BK2, and may display an image corresponding to the second frame data FD2 in the display area DA during a second frame F2. During the second frame F2, third frame data FD3 may be written in the first bank BK1 of the display device DD.

The display device DD may read the third frame data FD3 stored in the first bank BK1, and may display an image corresponding to the third frame data FD3 in the display area DA during a third frame F3. During the third frame F3, fourth frame data FD4 may be written in the second bank BK2 of the display device DD. In such an embodiment, the display device DD may read the fourth frame data FD4 stored in the second bank BK2 during a fourth frame F4. During the fourth frame F4, fifth frame data FD5 may be written in the first bank BK1. Also, the display device DD may read the fifth frame data FD5 stored in the first bank BK1 during a fifth frame F5. During the fifth frame F5, sixth frame data FD6 may be written in the second bank BK2.

In the normal frequency mode NFM, the display device DD may display an image in the display area DA at a normal frequency through the above process. According to an embodiment of the disclosure, where the normal frequency is 60 Hz, each of the first to sixth frames F1 to F6 may have a duration corresponding to approximately 16.7 milliseconds (ms).

Referring to FIGS. 5A and 5B, in the multi-frequency mode MFM, a speed (i.e., an internal processing speed) at which the host processor HP renders partial frame data HD1 to HD6 may not be uniform. In an embodiment, the internal processing speed of the host processor HP may vary depending on the partial frame data HD1 to HD6. In such an embodiment, when the display device DD is driven at a high speed, the image may be cut off if the internal processing speed of the host processor HP is slower than the operating speed of the display device DD.

According to an embodiment of the disclosure, in the multi-frequency mode MFM, the display device DD may control operating frequencies of the first and second display areas DA1 and DA2 depending on the internal processing speed of the host processor HP. In the multi-frequency mode MFM, the operating frequencies of the first and second display areas DA1 and DA2 may be changed depending on the internal processing speed of the host processor HP.

In the multi-frequency mode MFM, full frame data FFD1 to FFD3 and the partial frame data HD1 to HD6 provided from the host processor HP may be stored in the frame memory FM of the display device DD.

The frame memory FM may include a first bank BK1 and a second bank BK2. Each of the first and second banks BK1 and BK2 may have a size capable of storing full frame data corresponding to one full frame. The first full frame data FFD1 among the full frame data is stored in the first bank BK1. The first full frame data FFD1 is defined as data corresponding to the first and second display areas DA1 and DA2. Subsequently, the first and second partial frame data HD1 and HD2 following the first full frame data FFD1 may be stored in the second bank BK2. Each of the first partial frame data HD1 and the second partial frame data HD2 is defined as data corresponding to the first display area DA1.

When the n-th driving frame DFn is started, the display device DD may read the first full frame data FFD1 stored in the first bank BK1, and may display an image corresponding to the first full frame data FFD1 in the first and second display areas DA1 and DA2 during the first full frame FF1. During the first full frame FF1, the first and second partial frame data HD1 and HD2 may be written in the second bank BK2 of the display device DD.

The display device DD may read the first and second partial frame data HD1 and HD2 stored in the second bank BK2 and may display images corresponding to first and second partial frame data HD1 and HD2 in the first display area DA1 during the first and second partial frames HF1 and HF2, respectively. During the first and second partial frames HF1 and HF2, third and fourth partial frame data HD3 and HD4 may be written in the first bank BK1 of the display device DD.

The display device DD may read the third and fourth partial frame data HD3 and HD4 stored in the first bank BK1 and may display images corresponding to third and fourth partial frame data HD3 and HD4 in the first display area DA1 during the third and fourth partial frames HF3 and HF4, respectively. During the third and fourth partial frames HF3 and HF4, the second full frame data FFD2 may be written in the second bank BK2 of the display device DD.

In the multi-frequency mode MFM, the display device DD may display the first image IM1 in the first display area DA1 at the first operating frequency and may display the second image IM2 in the second display area DA2 at the second operating frequency, during the n-th driving frame DFn through the above process. According to an embodiment of the disclosure, the first operating frequency may be 100 Hz, and the second operating frequency may be 20 Hz.

When the (n+1)-th driving frame DFn+1 is started, the display device DD may read the second full frame data FFD2 stored in the second bank BK2, and may display an image corresponding to the second full frame data FFD2 in the first and second display areas DA1 and DA2 during the second full frame FF2. During the second full frame FF2, the fifth and sixth partial frame data HD5 and HD6 may be written in the first bank BK1 of the display device DD.

The display device DD may read the fifth and sixth partial frame data HD5 and HD6 stored in the first bank BK1 and may display images corresponding to fifth and sixth partial frame data HD5 and HD6 in the first display area DA1 during the fifth and sixth partial frames HF5 and HF6, respectively. During the fifth and sixth partial frames HF5 and HF6, the third full frame data FFD3 may be written in the second bank BK2 of the display device DD.

In the multi-frequency mode MFM, the display device DD may display the first image IM1 in the first display area DA1 at the third operating frequency and may display the second image IM2 in the second display area DA2 at the fourth operating frequency during the (n+1)-th driving frame DFn+1. Herein, the third operating frequency may be different from the first operating frequency, and the fourth operating frequency may be different from the second operating frequency. According to an embodiment of the disclosure, the first operating frequency may be 100 Hz, the second operating frequency may be 20 Hz, the third operating frequency may be 90 Hz, and the fourth operating frequency may be 30 Hz. The first to fourth operating frequencies may be changed variously, but not being limited thereto.

In the multi-frequency mode MFM, the operating frequency of the first display area DA1 may be changed in units of at least one driving frame, or may be periodically determined every unit period corresponding to the at least one driving frame. In an embodiment, the operating frequency of the first display area DA1 may vary in real time depending on the internal processing speed of the host processor HP. Accordingly, even when the first display area DA1 of the display device DD is driven at a high speed, the image may be effectively prevented from being cut off in the first display area DA1 due to the decrease in the internal processing speed of the host processor HP.

In an embodiment, as the operating frequency of the first display area DA1 is changed, the n-th driving frame DFn and the (n+1)-th driving frame DFn+1 may have different durations from each other. In such an embodiment, the n-th driving frame DFn has a first duration, and the (n+1)-th driving frame DFn+1 has a second duration. Here, the first duration may be different from the second duration.

When the first operating frequency is 100 Hz and the second operating frequency is 20 Hz, the n-th driving frame DFn may include the first full frame FF1 and four partial frames (i.e., the first to fourth partial frames HF1 to HF4). When the third operating frequency is 90 Hz and the fourth operating frequency is 30 Hz, the (n+1)-th driving frame DFn+1 may include the second full frame FF2 and two partial frames (i.e., the fifth and sixth partial frames HF5 and HF6). The duration of each of the first to fourth partial frames HF1 to HF4 may be different in size from that of each of the fifth and sixth partial frames HF5 and HF6. In one embodiment, for example, the duration of each of the first to fourth partial frames HF1 to HF4 may be approximately 10 ms, and the duration of each of the fifth and sixth partial frames HF5 and HF6 may be approximately 11.12 ms.

The duration of each of the partial frames HF1 to HF6 may be shorter than the duration of each of the first and second full frames FF1 and FF2. In one embodiment, for example, the duration of each of the first and second full frames FF1 and FF2 may be approximately 16.7 ms longer than the duration of each of the first to sixth partial frames HF1 to HF6.

In the multi-frequency mode MFM, as the operating frequency of the first display area DA1 is changed, the number of partial frames HF1 to HF4 included in the n-th driving frame DFn may be different from the number of partial frames HF5 and HF6 included in the (n+1)-th driving frame DFn+1. In an embodiment, the n-th driving frame DFn may include 4 partial frames HF1 to HF4, and the (n+1)-th driving frame may include two partial frames HF5 and HF6, for example.

According to an embodiment of the disclosure, the size of the first display area DA1 may be to the same as or different from the size of the second display area DA2. The size ratio of the first display area DA1 to the second display area DA2 may be used to set the first and second operating frequencies and to set the third and fourth operating frequencies. In such an embodiment, the size ratio of the first display area DA1 to the second display area DA2 may be variously changed depending on a usage mode of the display device DD.

Figure 6:
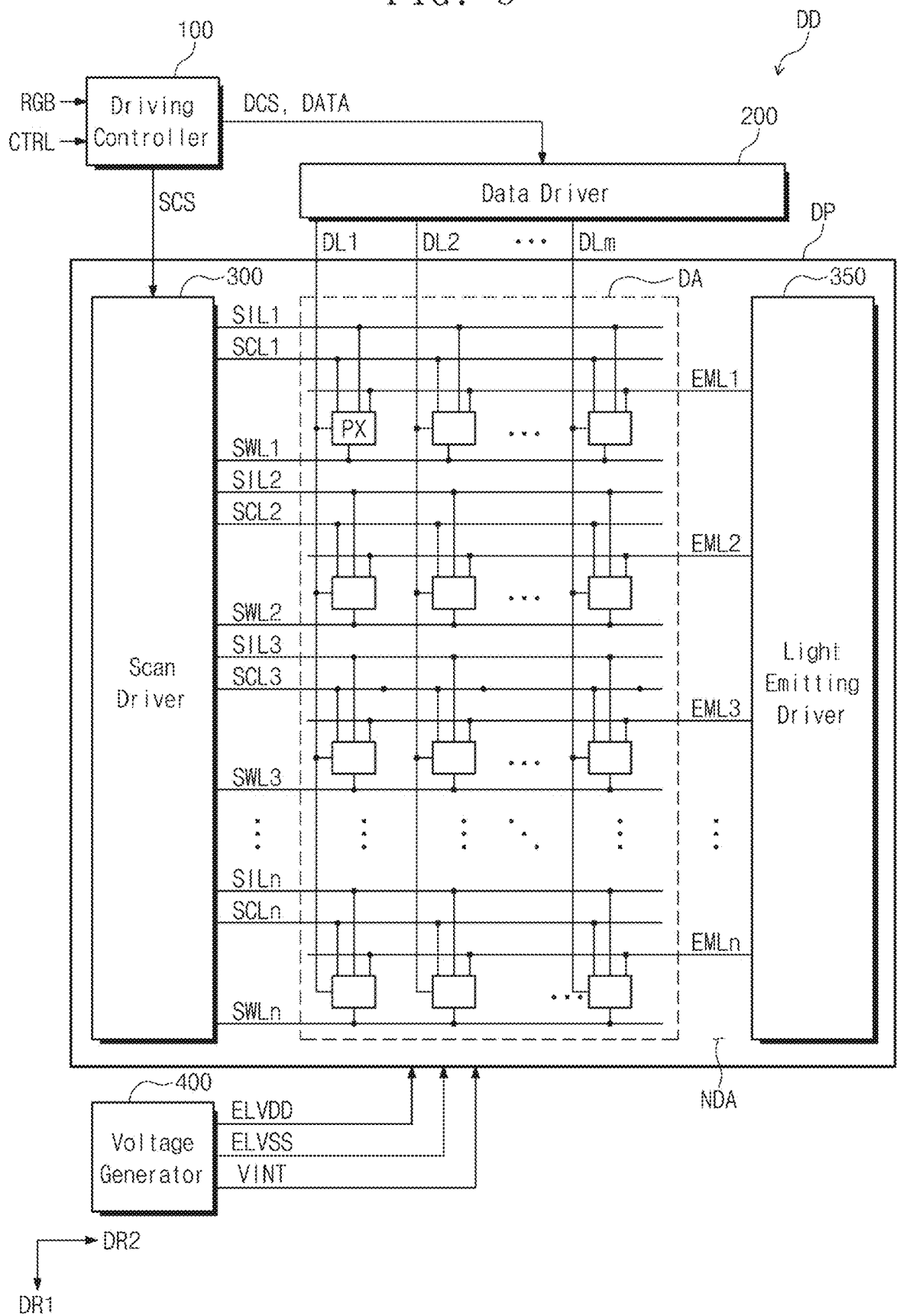
FIG. 6 is a block diagram of a display device according to an embodiment of the disclosure.
Figure 7:
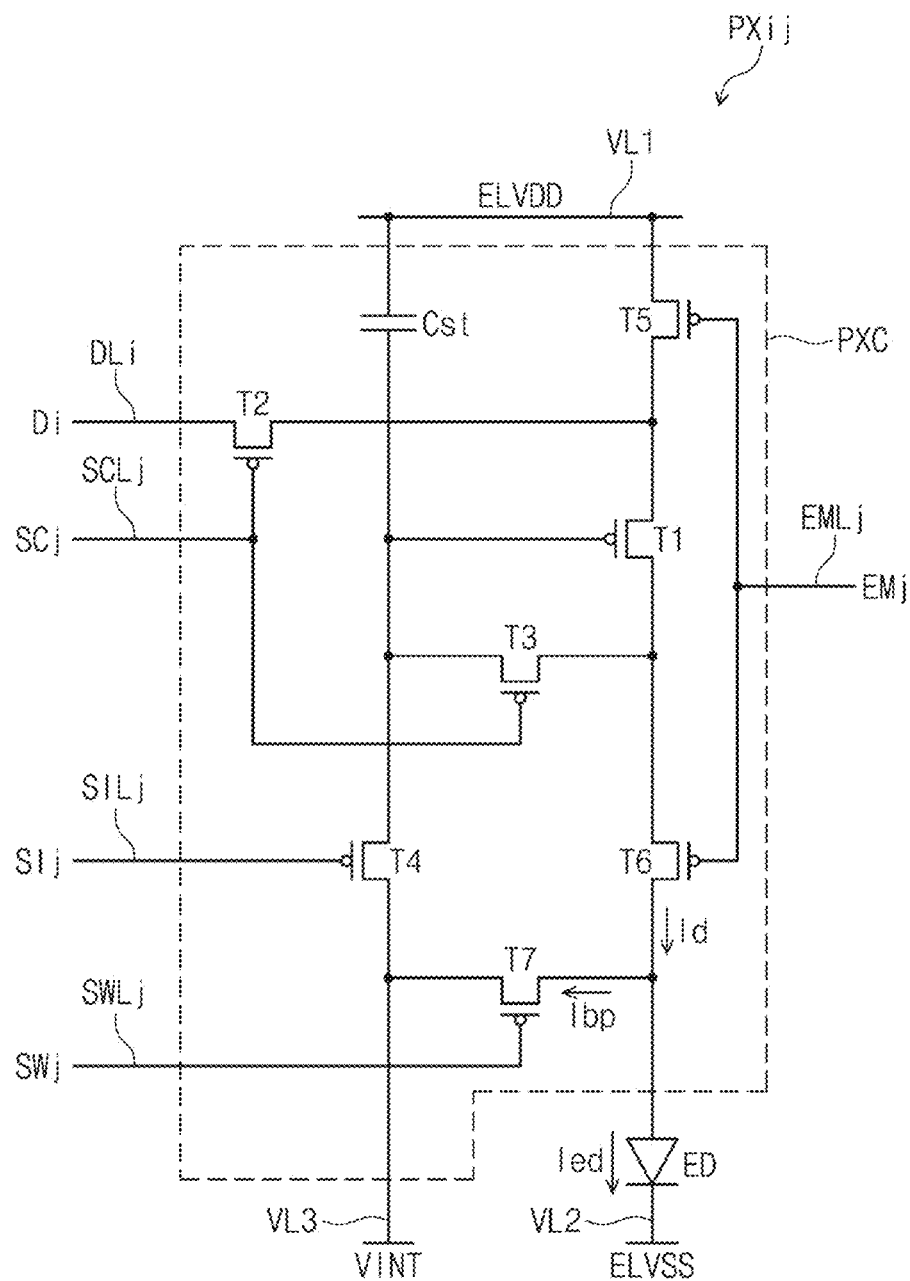
FIG. 7 is an equivalent circuit diagram of a pixel according to an embodiment of the disclosure.

FIG. 6 is a block diagram of a display device according to an embodiment of the disclosure. FIG. 7 is an equivalent circuit diagram of a pixel according to an embodiment of the disclosure.

Referring to FIGS. 6 and 7, an embodiment of the display device DD includes a display panel DP, a panel driver, and a driving controller 100. According to an embodiment of the disclosure, the panel driver includes a data driver 200, a scan driver 300, a light emitting driver 350, and a voltage generator 400.

The driving controller 100 receives an image signal RGB and a control signal CTRL. The driving controller 100 generates image data signal DATA by converting the data format of the image signal RGB to be suitable for the interface specification of the data driver 200. The driving controller 100 outputs a scan control signal SCS and a data control signal DCS.

The data driver 200 receives the data control signal DCS and the image data signal DATA from the driving controller 100. The data driver 200 converts the image data signal DATA into data signals and outputs the data signals to a plurality of data lines DL1 to DLm to be described later. The data signals are analog voltages corresponding to the gray-scale values of the image data signal DATA.

The scan driver 300 receives the scan control signal SCS from the driving controller 100. The scan driver 300 may output scan signals to scan lines in response to the scan control signal SCS.

The voltage generator 400 generates voltages used to operate the display panel DP. In an embodiment, the voltage generator 400 generates a first driving voltage ELVDD, a second driving voltage ELVSS, and an initialization voltage VINT.

The display panel DP includes initialization scan lines SIL1 to SILn, compensation scan lines SCL1 to SCLn, black scan lines SWL1 to SWLn, light emitting control lines EML1 to EMLn, data lines DL1 to DLm, and pixels PX. The initialization scan lines SIL1 to SILn, the compensation scan lines SCL1 to SCLn, the black scan lines SWL1 to SWLn, the light emitting control lines EML1 to EMLn, the data lines DL1 to DLm, and the pixels PX may overlap with the display area DA. The initialization scan lines SIL1 to SILn, the compensation scan lines SCL1 to SCLn, the black scan lines SWL1 to SWLn and the light emitting control lines EML1 to EMLn extend in the second direction DR2. The initialization scan lines SIL1 to SILn, compensation scan lines SCL1 to SCLn, black scan lines SWL1 to SWLn and light emitting control lines EML1 to EMLn are arranged to be spaced from one another in the first direction DR1. The data lines DL1 to DLm extend in the first direction DR1 and are arranged to be spaced from one another in the second direction DR2.

The plurality of pixels PX are electrically connected to the initialization scan lines SIL1 to SILn, the compensation scan lines SCL1 to SCLn, the black scan lines SWL1 to SWLn, the light emitting control lines EML1 to EMLn, and the data lines DL1 to DLm, respectively. Each of the plurality of pixels PX may be electrically connected to three scan lines. In one embodiment, for example, as illustrated in FIG. 6, pixels of the first row may be connected to the first initialization scan line SIL1, the first compensation scan line SCL1, and the first black scan line SWL1. In such an embodiment, pixels of the second row may be connected to the second initialization scan line SIL2, the second compensation scan line SCL2, and the second black scan line SWL2.

The scan driver 300 may be disposed in the non-display area NDA of the display panel DP. The scan driver 300 receives the scan control signal SCS from the driving controller 100. In response to the scan control signal SCS, the scan driver 300 may output initialization scan signals to the initialization scan lines SIL1 to SILn, may output compensation scan signals to compensation scan lines SCL1 to SCLn, and may output black scan signals to black scan lines SWL1 to SWLn. The circuit configuration and operation of the scan driver 300 will be described in detail later.

In an embodiment, the light emitting driver 350 may output light emitting control signals to light emitting control lines EML1 to EMLn. In an alternative embodiment, the scan driver 300 may be connected to the light emitting control lines EML1 to EMLn. In such an embodiment, the scan driver 300 may output light emitting control signals to the light emitting control lines EML1 to EMLn.

Each of the plurality of pixels PX includes a light emitting diode ED and a pixel circuit unit PXC that controls light emission of the light emitting diode ED. The pixel circuit unit PXC may include a plurality of transistors and a capacitor. The scan driver 300 may include transistors formed through a same process as the pixel circuit unit PXC.

Each of the plurality of pixels PX receives the first driving voltage ELVDD, the second driving voltage ELVSS, and the initialization voltage VINT.

FIG. 7 illustrates an equivalent circuit diagram of a pixel PXij among the plurality of pixels illustrated in FIG. 6. Each of the plurality of pixels has the same circuit structure as each other. Hereinafter, for convenience of description, a pixel PXij connected to an i-th data line DLi, an j-th compensation scan line SCLj, a j-th initialization scan line SILj and a j-th black scan line SWLj will be described in detail with reference to FIG. 7, and any repetitive detailed descriptions of the remaining pixels will be omitted. As shown in FIG. 7, the pixel PXij is connected to the i-th data line DLi (hereinafter, a data line) among the data lines DL1 to DLm, the j-th initialization scan line SILj (hereinafter, an initialization scan line) among the initialization scan lines SIL1 to SILn, the j-th compensation scan line SCLj (hereinafter, a compensation scan line) among the compensation scan lines SCL1 to SCLn, the j-th black scan line SWLj (hereinafter, a black scan line) among the black scan lines SWL1 to SWLn, and the j-th light emitting control line EMLj (hereinafter, a light emitting control line) among the light emitting control lines EML1 to EMLn.

The pixel PXij includes the light emitting diode ED and the pixel circuit unit PXC. The pixel circuit unit PXC includes first to seventh transistors T1, T2, T3, T4, T5, T6, and T7 and a single capacitor Cst. In an embodiment, each of the first to seventh transistors T1 to T7 may be a P-type transistor having a low-temperature polycrystalline silicon ("LTPS") semiconductor layer. However, the disclosure is not limited thereto. In one alternative embodiment, for example, the first to seventh transistors T1 to T7 may be N-type transistors using an oxide semiconductor as a semiconductor layer. In another alternative embodiment, at least one of the first to seventh transistors T1 to T7 may be an N-type transistor and the rest of the first to seventh transistors T1 to T7 may be P-type transistors. The configuration of the pixel circuit unit PXC according to the disclosure is not limited to an embodiment illustrated in FIG. 7, but not being limited thereto. Alternatively, the configuration of the pixel circuit unit PXC may be variously modified and implemented.

The j-th initialization scan signal SIj, the j-th compensation scan signal SCj, the j-th black scan signal SWj, and the j-th light emitting control signal EMj may be applied to the pixel PXij through the initialization scan line SILj, the compensation scan line SCLj, the black scan line SWLj, and the light emitting control line EMLj, respectively. A data signal Di is applied to the pixel PXij through the data line DLi. The data signal Di may have a voltage level corresponding to the image signal RGB input to the display device DD (see FIG. 6). The first driving voltage ELVDD, the second driving voltage ELVSS, and the initialization voltage VINT may be applied to the pixel PXij through the first to third driving voltage lines VL1, VL2, and VL3, respectively.

The first transistor T1 includes a first electrode connected to the first driving voltage line VL1 via the fifth transistor T5, a second electrode electrically connected to the anode of the light emitting diode ED via the sixth transistor T6, and a gate electrode connected to one end of the capacitor Cst. The first transistor T1 may receive the data signal Di delivered by the data line DLi based on the switching operation of the second transistor T2 and then may supply a driving current Id to the light emitting diode ED.

The second transistor T2 includes a first electrode connected to the data line DLi, a second electrode connected to the first electrode of the first transistor T1, and a gate electrode connected to the compensation scan line SCLj. The second transistor T2 may be turned on depending on the j-th compensation scan signal SCj received through the compensation scan line SCLj, and may apply the data signal Di transmitted from the data line DLi to the first electrode of the first transistor T1.

The third transistor T3 includes a first electrode connected to the gate electrode of the first transistor T1, a second electrode connected to the second electrode of the first transistor T1, and a gate electrode connected to the compensation scan line SCLj. The third transistor T3 may be turned on based on the j-th compensation scan signal SCj received through the compensation scan line SCLj, and thus, the gate electrode and the second electrode of the first transistor T1 may be connected, that is, the first transistor T1 may be diode-connected.

The fourth transistor T4 includes a first electrode connected to the gate electrode of the first transistor T1, a second electrode connected to the third driving voltage line VL3 through which the initialization voltage VINT is applied, and a gate electrode connected to the initialization scan line SILj. The fourth transistor T4 may be turned on depending on the initialization scan signal SIj received through the initialization scan line SILj such that the initialization voltage VINT is applied to the gate electrode of the first transistor T1. Accordingly, an initialization operation may be performed to initialize the voltage of the gate electrode of the first transistor T1.

The fifth transistor T5 includes a first electrode connected to the first driving voltage line VL1, a second electrode connected to the first electrode of the first transistor T1, and a gate electrode connected to the light emitting control line EMLj.

The sixth transistor T6 includes a first electrode connected to the second electrode of the first transistor T1, a second electrode connected to the anode of the light emitting diode ED, and a gate electrode connected to the light emitting control line EMLj.

The fifth transistor T5 and sixth transistor T6 are simultaneously turned on based on the j-th light emitting control signal EMj received through the light emitting control line EMLj. The first driving voltage ELVDD applied through the fifth transistor T5 turned on may be compensated through the first transistor T1 diode-connected and then may be applied to the light emitting diode ED.

The seventh transistor T7 includes a first electrode connected to the second electrode of the fourth transistor T4, a second electrode connected to the second electrode of the sixth transistor T6, and a gate electrode connected to the black scan line SWLj.

As described above, the one end of the capacitor Cst is connected to the gate electrode of the first transistor T1, and the other end of the capacitor Cst is connected to the first driving voltage line VL1. The cathode of the light emitting diode ED may be connected to the second driving voltage line VL2 that delivers the second driving voltage ELVSS.

When the j-th initialization scan signal SIj having a low level is provided through the initialization scan line SILj, the fourth transistor T4 is turned on in response to the j-th initialization scan signal SIj having the low level. The initialization voltage VINT is delivered to the gate electrode of the first transistor T1 through the fourth transistor T4 turned on, and the first transistor T1 is initialized by the initialization voltage VINT.

Next, when the j-th compensation scan signal SCj of a low level is supplied through the compensation scan line SCLj, the third transistor T3 is turned on. The first transistor T1 is diode-connected by the third transistor T3 turned on and may be forward-biased. Also, the second transistor T2 is turned on by the j-th compensation scan signal SCj having a low level. Then, the compensation voltage "Di-Vth" obtained by reducing the voltage of the data signal Di supplied from the data line DLi by the threshold voltage Vth of the first transistor T1 is applied to the gate electrode of the first transistor T1. That is, the potential of the gate electrode of the first transistor T1 may be the compensation voltage, which is a voltage obtained by subtracting the threshold voltage Vth of the first transistor T1 from the voltage of the data signal Di, i.e., "Di-Vth".

The first driving voltage ELVDD and the compensation voltage (Di-Vth) may be applied to both ends of the capacitor Cst, and the charge corresponding to the voltage difference between both ends may be stored in the capacitor Cst.

When the j-th black scan signal SWj of a low level is applied through the black scan line SWLj, the seventh transistor T7 is turned on. A part of the driving current Id may flow through the seventh transistor T7 as a bypass current Ibp.

When the light emitting diode ED emits light even though the minimum current of the first transistor T1 for displaying a black image flows as the driving current, the black image is not displayed properly. Accordingly, in an embodiment, the seventh transistor T7 in the pixel PXij may distribute a part of the minimum current of the first transistor T1 as the bypass current Ibp to other current paths except for the current path toward the light emitting diode ED. Herein, the minimum current of the first transistor T1 means the current under the condition that the first transistor T1 is turned off because the gate-source voltage (Vgs) of the first transistor T1 is less than the threshold voltage (Vth). In this way, the minimum driving current (e.g., a current of about 10 pico-ampere (pA) or less) under the condition of turning off the first transistor T1 is applied to the light emitting diode ED, and thus an image of a black luminance is represented. When the minimum driving current of displaying a black image flows, the bypass current Ibp is greatly affected. On the other hand, when a large driving current of displaying an image such as a normal image or a white image flows, the bypass current Ibp is not nearly affected. Accordingly, when the driving current of displaying a black image flows, the light emitting current Ted of the light emitting diode ED obtained by subtracting the amount of the bypass current Ibp flowing through the seventh transistor T7 from the driving current Id has the minimum amount of current at a level capable of precisely representing a black image. Accordingly, the contrast ratio may be improved by implementing an image of an accurate black luminance by using the seventh transistor T7.

Next, the j-th light emitting control signal EMj supplied from the light emitting control line EMLj is changed from a high level to a low level. The fifth transistor T5 and the sixth transistor T6 are turned on by the light emitting control signal EMj having a low level. Then, the driving current Id corresponding to the voltage difference between the gate voltage of the gate electrode of the first transistor T1 and the first driving voltage ELVDD occurs. The driving current Id is supplied to the light emitting diode ED through the sixth transistor T6, and the current Ied flows into the light emitting diode ED.

Figure 8:
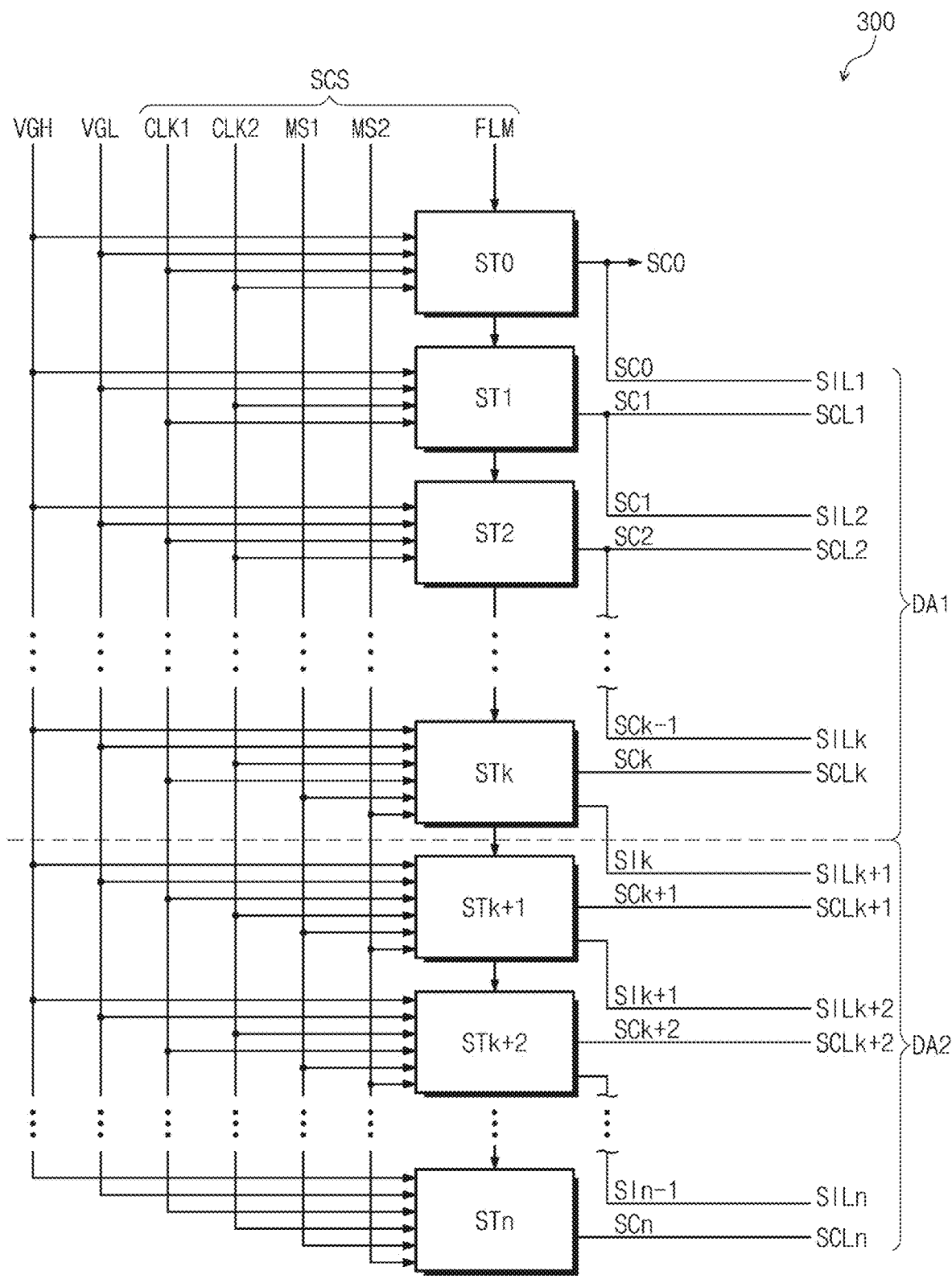
FIG. 8 is a block diagram of a scan driver according to an embodiment of the disclosure.
Figure 9:
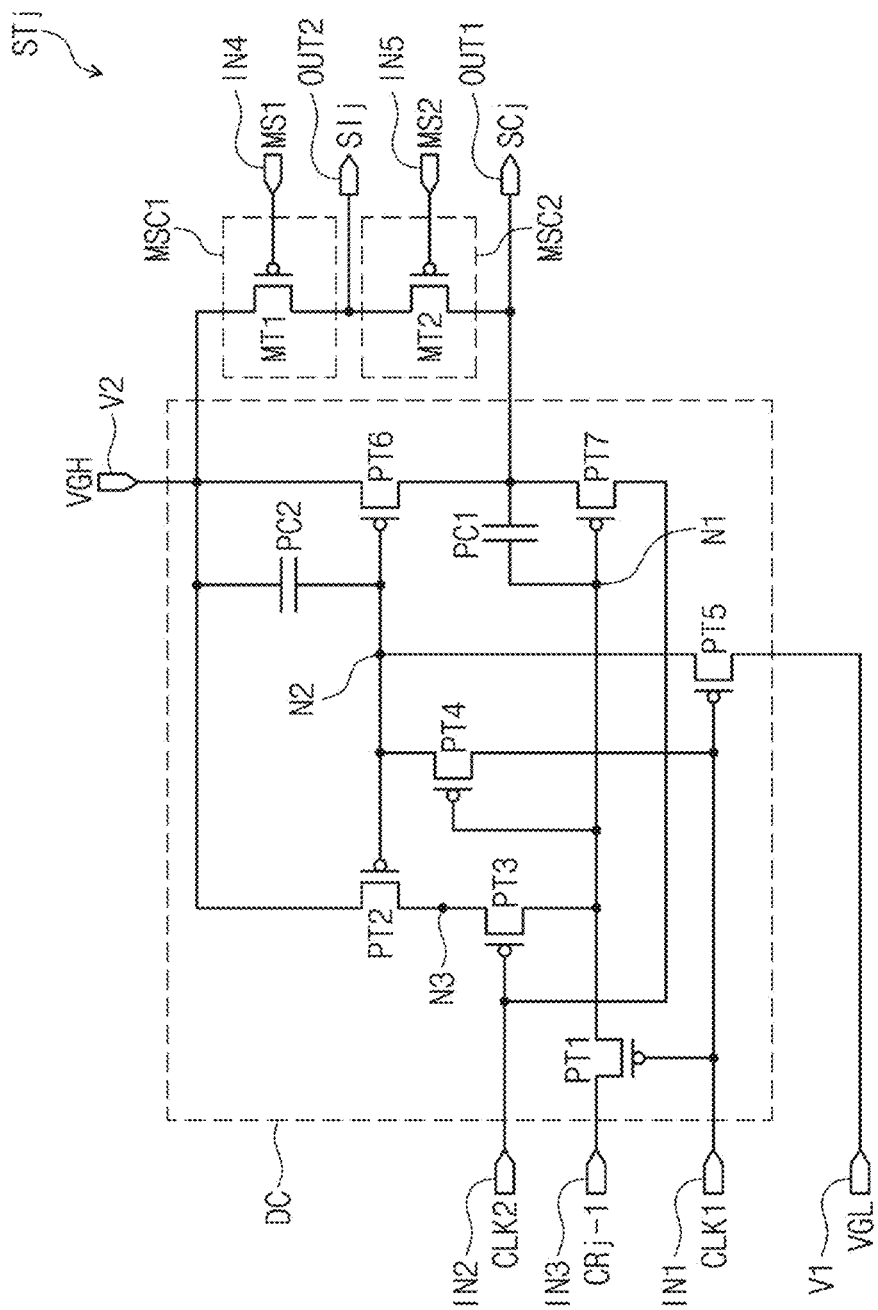
FIG. 9 is a circuit diagram illustrating a j-th driving stage among driving stages illustrated in FIG. 8.
Figure 10:
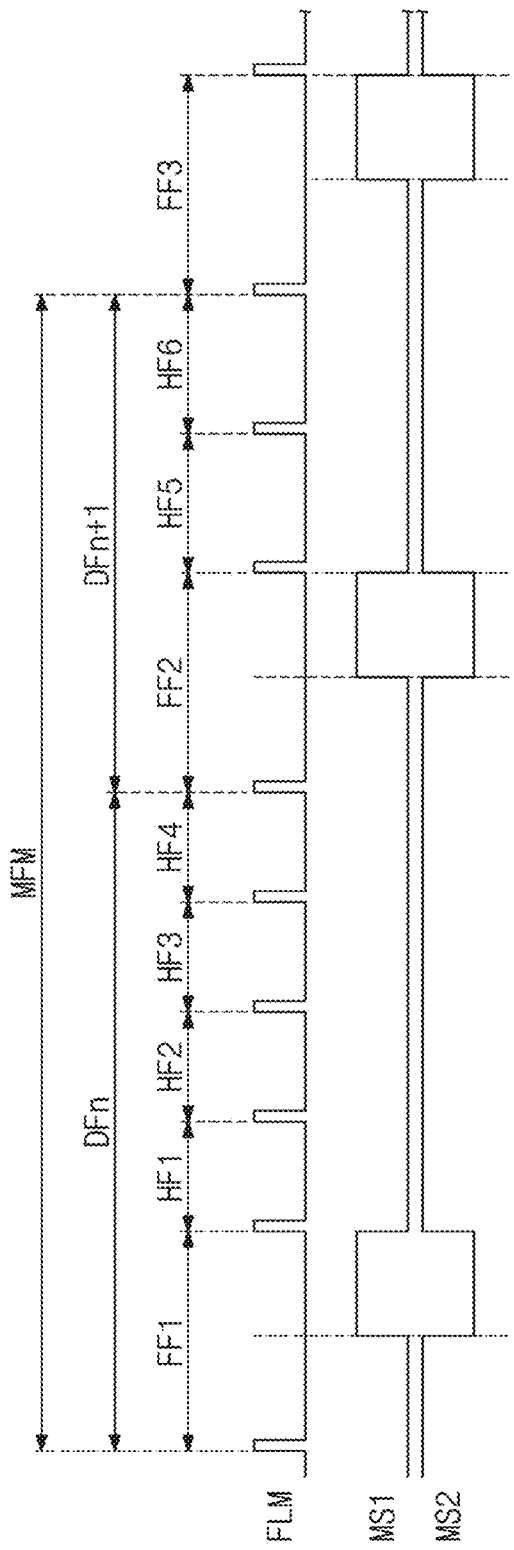
FIG. 10 is a waveform diagram illustrating a start signal and first and second masking signals in a multi-frequency mode.

FIG. 8 is a block diagram of a scan driver according to an embodiment of the disclosure. FIG. 9 is a circuit diagram illustrating a j-th driving stage among driving stages illustrated in FIG. 8. FIG. 10 is a waveform diagram illustrating a start signal and first and second masking signals in a multi-frequency mode.

Referring to FIG. 8, an embodiment of the scan driver 300 includes driving stages ST0 to STn. Each of the driving stages ST0 to STn receives the scan control signal SCS from the driving controller 100 illustrated in FIG. 6. The scan control signal SCS includes a start signal FLM, a first clock signal CLK1, a second clock signal CLK2, and a masking signal. The masking signal may include a first masking signal MS1 and a second masking signal MS2. Each of the driving stages ST0 to STn further receives a first voltage VGL and a second voltage VGH. The first voltage VGL and the second voltage VGH may be provided from the voltage generator 400 illustrated in FIG. 6.

The first masking signal MS1 and the second masking signal MS2 are provided to some driving stages STk to STn among the driving stages ST0 to STn in the multi-frequency mode MFM and are used to mask the scan signals supplied to the second display area DA2 at a predetermined level.

In an embodiment, the driving stages ST0 to STn output compensation scan signals SC0 to SCn, respectively. Each of the driving stages ST0 to STn may include a first output terminal for outputting the corresponding compensation scan signal. The corresponding compensation scan line is connected to the first output terminal of each of the driving stages ST1 to STn. The compensation scan signals SC1 to SCn among the compensation scan signals SC0 to SCn are provided as the compensation scan lines SCL1 to SCLn, respectively. In an embodiment, the first output terminal of the first driving stage ST1 among the driving stages ST1 to STn is connected to the corresponding first compensation scan line SCL1, and supplies the first compensation scan signal SC1 to the first compensation scan line SCL1.

The corresponding initialization scan line may be connected to the first output terminal of each of the driving stages ST0 to STk−1 among the driving stages ST0 to STn. The compensation scan signals SC0 to SCk−1 output from the first output terminals of the driving stages ST0 to STk−1 are provided to the initialization scan lines SIL1 to SILk, respectively. In an embodiment, the first output terminal of the first driving stage ST1 among the driving stages ST0 to STk−1 is connected to the corresponding second initialization scan line SIL2 and supplies the first compensation scan signal SC1 to the second initialization scan line SIL2. According to an embodiment of the disclosure, the first compensation scan signal SC1 may be supplied to the second initialization scan line SIL2 as the second initialization scan signal.

The driving stages STk to STn among driving stages ST0 to STn further include second output terminals. The corresponding initialization scan line may be connected to the second output terminals of the driving stages STk to STn. The initialization scan signals SIk to SIn−1 output from the second output terminals of the driving stages STk to STn are provided to initialization scan lines SILk+1 to SILn, respectively. In an embodiment, the second output terminal of the k-th driving stage STk among the driving stages STk to STn is connected to the corresponding (k+1)-th initialization scan line SILk+1, and supplies a k-th initialization scan signal to the (k+1)-th initialization scan line SILk+1. In such an embodiment, according to an embodiment of the disclosure, the k-th initialization scan signal SIk may be supplied to the (k+1)-th initialization scan line SILk+1 as the (k+1)-th initialization scan signal.

Herein, the first to k-th initialization scan lines SIL1 to SILk among the n initialization scan lines SIL1 to SILn are arranged in the first display area DA1; the (k+1)-th to n-th initialization scan lines SILk+1 to SILn among the n initialization scan lines SIL1 to SILn are arranged in the second display area DA2. The first to k-th compensation scan lines SCL1 to SCLk among the n compensation scan lines SCL1 to SCLn are arranged in the first display area DA1, and the (k+1)-th to n-th compensation scan lines SCLk+1 to SCLn among the n compensation scan lines SCL1 to SCLn are arranged in the second display area DA2.

In FIG. 8, the black scan lines SWL1 to SWLn illustrated in FIG. 6 are not shown. In an embodiment, each of the driving stages ST1 to STn of the scan driver 300 may be connected to a corresponding black scan line, but the disclosure is not limited thereto. Alternatively, the scan driver 300 may further include driving stages for respectively providing black scan signals to the black scan lines SWL1 to SWLn in addition to the driving stages ST1 to STn.

The driving stage ST0 may receive the start signal FLM as a carry signal. Each of the driving stages ST1 to STn receives the carry signal from the previous driving stage. In one embodiment, for example, the driving stage ST1 receives the carry signal from the previous driving stage ST0, and the driving stage ST2 receives the carry signal from the previous driving stage ST1. According to an embodiment of the disclosure, the carry signal may be the same signal as the compensation scan signal output from the previous driving stage ST1. The compensation scan signal output from the immediately previous driving stage may be provided to the first to k-th driving stages ST1 to STk among the driving stages ST1 to STn, as the carry signal. Alternatively, the initialization scan signal output from the immediately previous driving stage may be provided as the carry signal in the (k+1)-th to n-th driving stage STk+1 to STn among the driving stages ST1 to STn. However, the disclosure is not limited thereto. In an embodiment, the carry signal output from one of previous driving stages may be provided to each of the driving stages ST1 to STn.

The first masking signal MS1 and the second masking signal MS2 are provided to some driving stages STk to STn among the driving stages ST0 to STn in the multi-frequency mode MFM, and are used to mask the scan signals supplied to the second display area DA2 at a predetermined level. According to an embodiment of the disclosure, the first and second masking signals MS1 and MS2 may not be provided to some driving stages ST0 to STk−1 among the driving stages ST0 to STn. FIG. 9 schematically illustrates a driving stage STj (i.e., the j-th driving stage) among the driving stages STk to STn to which the first and second masking signals MS1 and MS2 are provided.

Each of the driving stages STk to STn illustrated in FIG. 8 may include a same circuit configuration as the j-th driving stage STj. Hereinafter, the j-th driving stage STj will be referred to as a "driving stage STj".

Referring to FIG. 9, an embodiment of the driving stage STj includes a driving circuit DC, a masking circuit, first to fifth input terminals IN1, IN2, IN3, IN4, and IN5, first and second voltage terminals V1 and V2, and first and second output terminals OUT1 and OUT2. The masking circuit may include a first masking circuit MSC1 and a second masking circuit MSC2.

The driving circuit DC includes driving transistors PT1 to PT7 and driving capacitors PC1 and PC2. The driving circuit DC receives a first clock signal CLK1, a second clock signal CLK2, and a carry signal CRj−1 through the first to third input terminals IN1 to IN3, respectively. The driving circuit DC receives a first voltage VGL and a second voltage VGH through the first voltage terminal V1 and the second voltage terminal V2, respectively. The driving circuit DC outputs a j-th compensation scan signal SCj and a j-th initialization scan signal SIj through the first and second output terminals OUT1 and OUT2, respectively. The carry signal CRj−1 received through the third input terminal IN3 may be a (j−1)-th compensation scan signal output from the previous driving stage.

In an embodiment, the first input terminal IN1 of each of some driving stages (e.g., odd-numbered driving stages) among the driving stages ST0 to STn illustrated in FIG. 8 receives the first clock signal CLK1, and the second input terminals IN2 thereof receives the second clock signal CLK2. In such an embodiment, the first input terminal IN1 of each of the remaining driving stages (e.g., even-numbered driving stages) among the driving stages ST0 to STn receives the second clock signal CLK2, and the second input terminals IN2 thereof receives the first clock signal CLK1.

The first driving transistor PT1 is connected between the third input terminal IN3 and a first node N1, and includes a gate electrode connected to the first input terminal IN1. The second driving transistor PT2 is connected between the second voltage terminal V2 and a third node N3, and includes a gate electrode connected to a second node N2. The third driving transistor PT3 is connected between the third node N3 and the first node N1, and includes a gate electrode connected to the second input terminal IN2.

The fourth driving transistor PT4 is connected between the second node N2 and the first input terminal IN1, and includes a gate electrode connected to the first node N1. The fifth driving transistor PT5 is connected between the second node N2 and the first voltage terminal V1, and includes a gate electrode connected to the first input terminal IN1. The sixth driving transistor PT6 is connected between the second voltage terminal V2 and the first output terminal OUT1, and includes a gate electrode connected to the second node N2. The seventh driving transistor PT7 is connected between the first output terminal OUT1 and the second input terminal IN2, and includes a gate electrode connected to the first node N1.

The first driving capacitor PC1 is connected between the first node N1 and the first output terminal OUT1. The second driving capacitor PC2 is connected between the second voltage terminal V2 and the second node N2.

The first masking circuit MSC1 includes a first masking transistor MT1. The first masking transistor MT1 is connected between the second voltage terminal V2 and the second output terminal OUT2, and includes a gate electrode connected to the fourth input terminal IN4. The second masking circuit MSC2 includes a second masking transistor MT2. The second masking transistor MT2 is connected between the first output terminal OUT1 and the second output terminal OUT2, and includes a gate electrode connected to the fifth input terminal IN5. The first masking circuit MSC1 stops (or masks) the output of the j-th initialization scan signal SIj in response to the first masking signal MS1 received through the fourth input terminal IN4. The second masking circuit MSC2 stops (or masks) the output of the j-th compensation scan signal SCj in response to the second masking signal MS2 received through the fifth input terminal IN5.

Referring to FIGS. 8, 9 and 10, the start signal FLM supplied to the scan driver 300 is activated at a start point of each of the full frames FF1 to FF3 and the start point of each of the partial frames HF1 to HF6. During each of the full frame FF1 to FF3, the start signal FLM is generated to have a first period corresponding to the duration of each of the full frame FF1 to FF3; during each of the partial frame HF1 to HF6, the start signal FLM is generated to have a second period corresponding to the duration of each of the partial frame HF1 to HF6. The second period may be different in size from the first period. According to an embodiment of the disclosure, the first period may be greater than the second period.

In an embodiment, the first and second masking signals MS1 and MS2 may have phases opposite to each other. In such an embodiment, the inactive section of the first masking signal MS1 corresponds to the active section of the second masking signal MS2, and the active section of the first masking signal MS1 corresponds to the inactive section of the second masking signal MS2. Accordingly, the first and second masking transistors MT1 and MT2 may be alternately turned on by the first and second masking signals MS1 and MS2. According to an embodiment of the disclosure, the first masking signal MS1 is deactivated during the full frames FF1, FF2, and FF3, and is activated during the first to sixth partial frames HF1 to HF6. In such an embodiment, the second masking signal MS2 is activated during the full frames FF1, FF2, and FF3, and is deactivated during the first to sixth partial frames HF1 to HF6.

In an embodiment, during the full frames FF1, FF2 and FF3, the first masking signal MS1 has a first level (e.g., a high level), and the first masking transistor MT1 is turned off in response to the first masking signal MS1. The second voltage terminal V2 and the second output terminal OUT2 are electrically separated from each other by the first masking transistor MT1 that is turned off.

During the full frame FF1, FF2, and FF3, the second masking signal MS2 has a second level (e.g., a low level), and the second masking transistor MT2 is turned on in response to the second masking signal MS2. The first output terminal OUT1 and the second output terminal OUT2 are electrically connected to each other by the second masking transistor MT2 that is turned on. When the first output terminal OUT1 and the second output terminal OUT2 are electrically connected to each other, the j-th compensation scan signal SCj output through the first output terminal OUT1 may be provided to the second output terminal OUT2 through the second masking transistor MT2 that is turned on. Accordingly, during the full frames FF1 and FF2, the j-th driving stage STj may output the j-th compensation scan signal SCj and the j-th initialization scan signal SIj through the first and second output terminals OUT1 and OUT2, respectively.

In such an embodiment, during the first to sixth partial frame HF1 to HF6, the first masking signal MS1 has a low level, and the first masking transistor MT1 is turned on in response to the first masking signal MS1. The second voltage terminal V2 and the second output terminal OUT2 are electrically connected to each other by the first masking transistor MT1 that is turned on. Accordingly, the j-th initialization scan signal SIj output from the second output terminal OUT2 is deactivated during the first to sixth partial frame HF1 to HF6.

During the first to sixth partial frame HF1 to HF6, the second masking signal MS2 has a high level, and the second masking transistor MT2 is turned off in response to the second masking signal MS2. The first output terminal OUT1 and the second output terminal OUT2 are electrically separated from each other by the second masking transistor MT2 that is turned off.

Even when the k-th compensation scan signal SCk is output through the first output terminal OUT1 of the k-th driving stage STk, the k-th compensation scan signal SCk may not be provided to the second output terminal OUT2. Moreover, the k-th initialization scan signal SIk may be deactivated by the second voltage VGH supplied to the second output terminal OUT2 of the k-th driving stage STk through the first masking transistor MT1 that is turned on. Accordingly, driving stages from the (k+1)-th driving stage STk+1 to the n-th driving stage STn, which receive the k-th initialization scan signal SIk as the carry signal, are not activated during the first to sixth partial frame HF1 to HF6. Accordingly, during the first to sixth partial frame HF1 to HF6, scan signals are not supplied to the second display area DA2, such that an image is not displayed in the second display area DA2.

Figure 11:
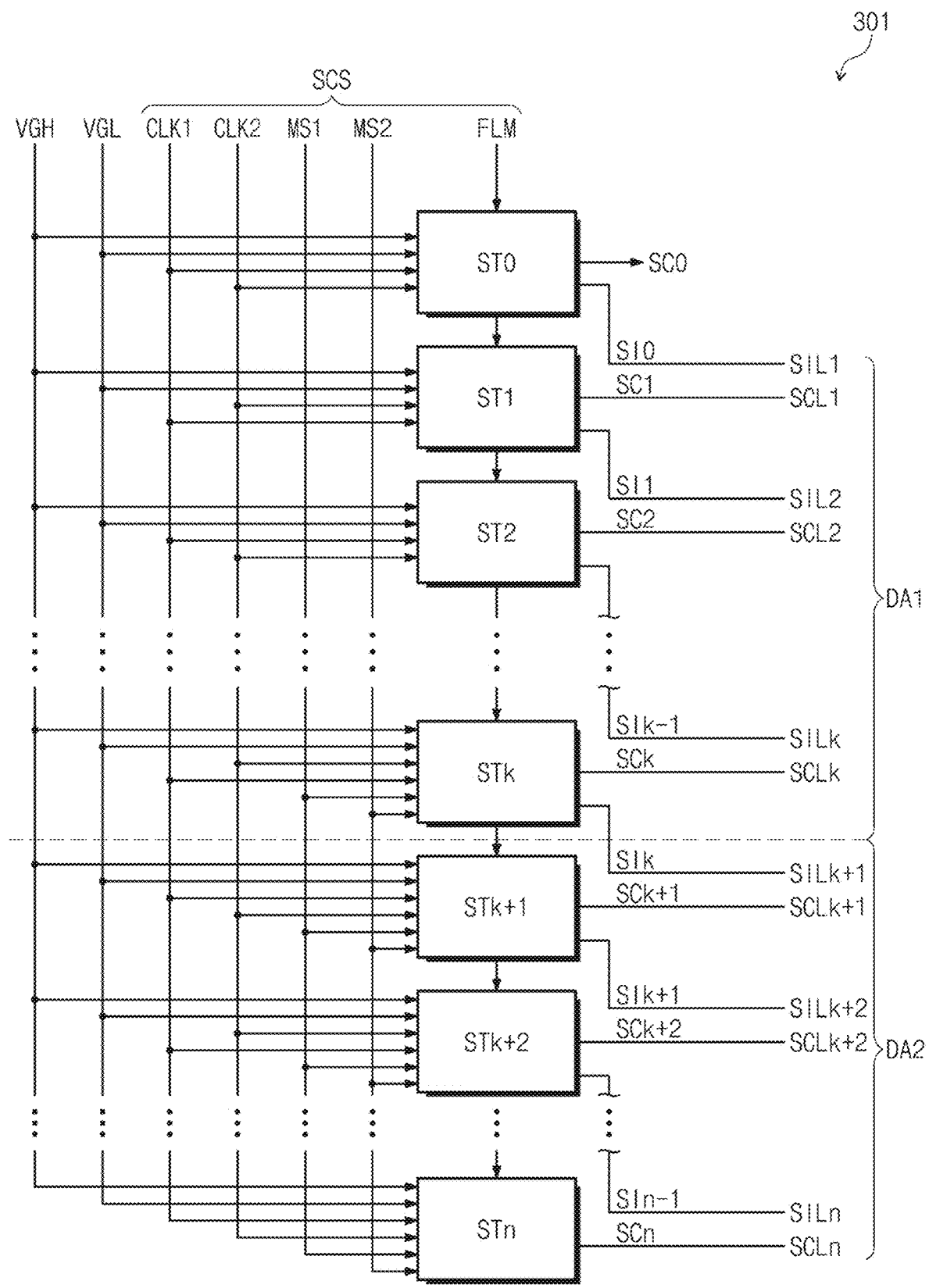
FIG. 11 is a block diagram of a scan driver according to an embodiment of the disclosure.

FIG. 11 is a block diagram of a scan driver according to an embodiment of the disclosure.

FIGS. 8 to 10 illustrate an embodiment of the scan driver 300 applied to a structure in which the location and size of the second display area DA2 are fixed in the display device DD, and the first and second masking signals MS1 and MS2 provided to the scan driver 300. However, the disclosure is not limited thereto. In an embodiment, where the location and size of the second display area DA2 are changed, a scan driver 301 applied to the display device DD may be different in structure from the scan driver 300 illustrated in FIG. 8.

Referring to FIG. 11, an embodiment of a scan driver 301 includes driving stages ST0 to STn. Each of the driving stages ST0 to STn receives the scan control signal SCS from the driving controller 100 illustrated in FIG. 6. The scan control signal SCS includes a start signal FLM, a first clock signal CLK1, a second clock signal CLK2, a first masking signal MS1 and a second masking signal MS2.

In an embodiment, the first masking signal MS1 and the second masking signal MS2 may be provided to the driving stages ST0 to STn in the multi-frequency mode MFM. The first masking signal MS1 and the second masking signal MS2 are signals of masking the scan signals supplied to the second display area DA2 at a predetermined level. In such an embodiment, each of the driving stages ST0 to STn may include a driving circuit DC (illustrated in FIG. 9), and first and second masking circuits MSC1 and MSC2 (illustrated in FIG. 9). Accordingly, when the location and size of the second display area DA2 are changed in the display device DD, the scan signals may be masked based on the changed location and size of the second display area DA2.

In an embodiment, each of the driving stages ST0 to STn may include a first output terminal for outputting the corresponding compensation scan signal and a second output terminal for outputting the corresponding initialization scan signal. The circuit configuration of each of the driving stage ST0 to STn illustrated in FIG. 11 is similar to the circuit configuration of the j-th driving stage STj illustrated in FIG. 9, and thus any repetitive detailed descriptions thereof will be omitted.

Figure 12A:
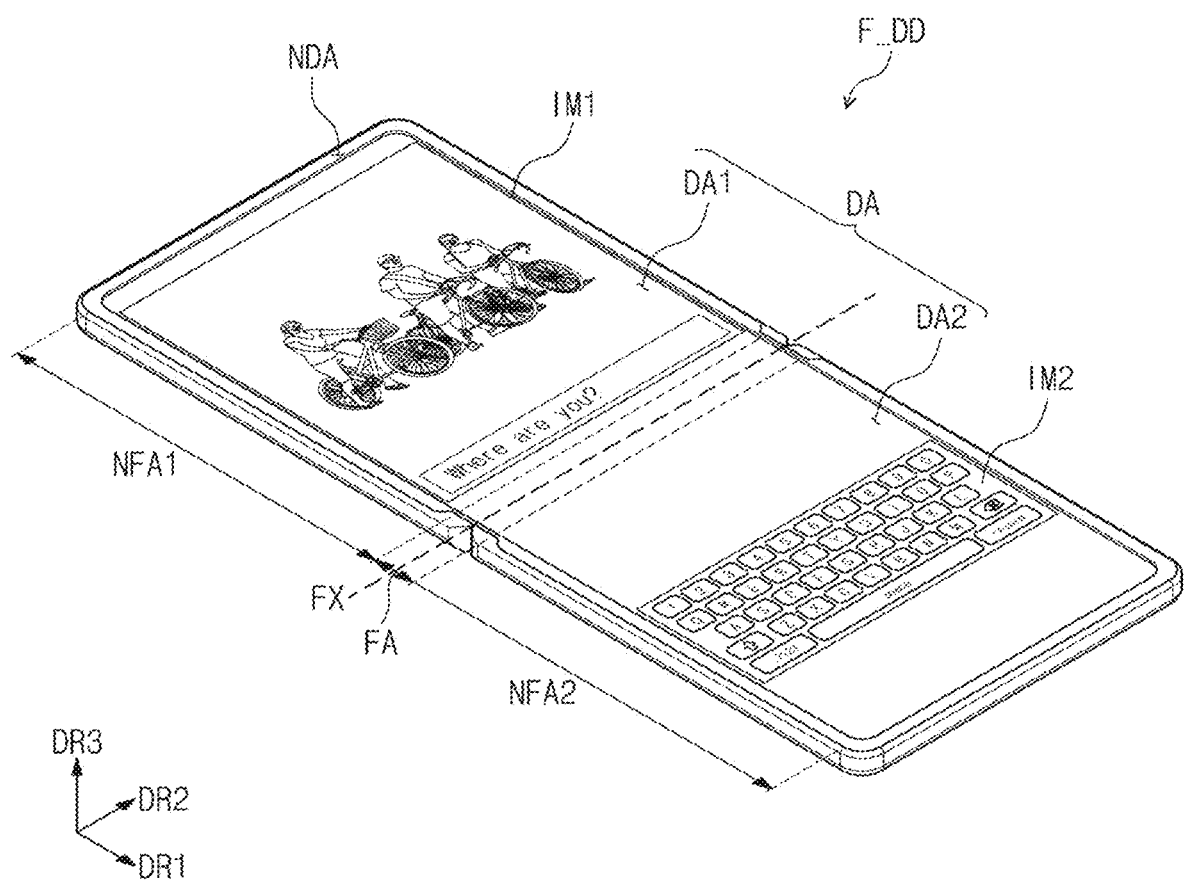
FIGS. 12A and 12B are perspective views of a display device according to an embodiment of the disclosure.
Figure 12B:
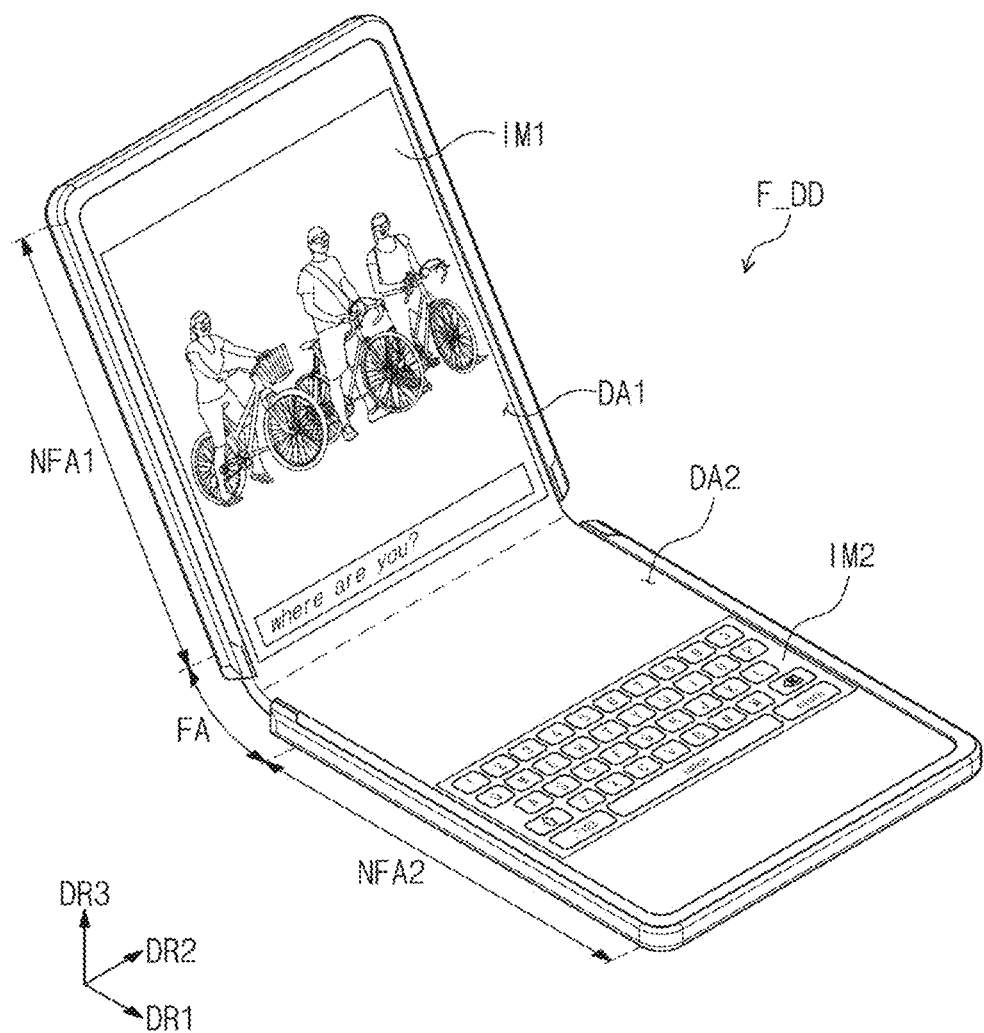

FIG. 12A is a perspective view illustrating a display device in an unfolded state according to an embodiment of the disclosure. FIG. 12B is a perspective view illustrating a display device illustrated in FIG. 12A in a folded state.

An embodiment in which a display device F_DD is a mobile phone is illustrated in FIGS. 12A and 12B. However, the disclosure is not limited thereto. Alternatively, the display device F_DD may be a tablet personal computer ("PC"), a smartphone, a personal digital assistant ("PDA"), a portable multimedia player ("PMP"), a game console, a wristwatch-type electronic device, or the like. Embodiments of the disclosure may be employed in a PC, a notebook computer, a kiosk, a car navigation unit, small and medium-sized electronic equipment such as a camera, in addition to large-sized electronic equipment such as a television or an outside billboard, for example, but not being limited thereto. Alternatively, such embodiments may be employed in other electronic devices as long as these do not depart from the concept of the disclosure.

The display device F_DD includes a display area DA and a non-display area NDA. The display device F_DD may display images IM1 and IM2 through the display area DA. The display area DA may include a plane defined by a first direction DR1 and a second direction DR2, in a state where the display device F_DD is unfolded. The non-display area NDA surrounds the display area DA. The display area DA may include a first non-folding area NFA1, a folding area FA, and a second non-folding area NFA2. The folding area FA may be bent around a folding axis FX extending in the second direction DR2.

When the display device F_DD is folded, the first non-folding area NFA1 and the second non-folding area NFA2 may face each other. In such a folded state, the display area DA may not be exposed to the outside, which may be referred to as an "in-folding state". When the display device F_DD is folded, the first non-folding area NFA1 and the second non-folding area NFA2 may be opposite to each other. In such a folded state, the display area DA may be exposed to the outside, which may be referred to as an "out-folding state".

In an embodiment, the display device F_DD may perform only one of an in-folding operation or an out-folding operation. Alternatively, the display device F_DD may perform both the in-folding operation and the out-folding operation. In such an embodiment, the folding area FA of the display device F_DD may be in-folded and out-folded. Alternatively, a partial area of the display device F_DD may be in-folded, and another partial area may be out-folded.

FIGS. 12A and 12B illustrate an embodiment including a single folding area FA and the two non-folding areas NFA1 and NFA2. However, the number of folding areas and the number of non-folding areas are not limited thereto. In one embodiment, for example, the display device F_DD may include a plurality of non-folding areas, of which the number is greater than two, and a plurality of folding areas, each of which is interposed between the non-folding areas adjacent to one another.

FIGS. 12A and 12B illustrate one embodiment in which the folding axis FX is parallel to the short edge of the display device F_DD. However, the disclosure is not limited thereto. In one alternative embodiment, for example, the folding axis FX may extend in a direction parallel to the long edge of the display device F_DD, for example, the first direction DR1. In such an embodiment, the first non-folding area NFA1, the folding area FA, and the second non-folding area NFA2 may be sequentially arranged in the second direction DR2.

The display area DA of the display device F_DD may include a plurality of display areas DA1 and DA2. In an embodiment, as illustrated in FIG. 12A, the display area DA of the display device F_DD may include two display areas DA1 and DA2, for example. However, the number of display areas DA1 and DA2 included in the display area DA is not limited thereto.

The plurality of display areas DA1 and DA2 may include the first display area DA1 and the second display area DA2. In one embodiment, for example, the first display area DA1 may be an area where the first image IM1 is displayed. The second display area DA2 may be an area where the second image IM2 is displayed. In one embodiment, for example, the first image IM1 may be a video, and the second image IM2 may be a text image having a long change period or a still image.

In the normal frequency mode, an embodiment of the display device F_DD may drive both the first display area DA1 and the second display area DA2 at a normal frequency. In the multi-frequency mode, such an embodiment of the display device F_DD may drive the first display area DA1 where the first image IM1 is displayed at an operating frequency higher than the normal frequency, and may drive the second display area DA2, in which the second image IM2 is displayed, at an operating frequency lower than the normal frequency. The display device F_DD may increase the operating frequency of the first display area DA1, thereby improving the display quality of the video. The display device DD may reduce power consumption by lowering the operating frequency of the second display area DA2.

In an embodiment, the size of each of the first display area DA1 and the second display area DA2 may be a preset size, and may be changed by an application program. In an embodiment, the first display area DA1 may correspond to the first non-folding area NFA1, and the second display area DA2 may correspond to the second non-folding area NFA2. In such an embodiment, a portion of the folding area FA may correspond to the first display area DA1, and the remaining portion of the folding area FA may correspond to the second display area DA2.

In an embodiment, the first display area DA1 may correspond to a portion of the first non-folding area NFA1, and the second display area DA2 may correspond to the remaining portion of the first non-folding area NFA1, the folding area FA, and the second non-folding area NFA2. In such an embodiment, the size of the first display area DA1 may be less than the size of the second display area DA2.

In an embodiment, the first display area DA1 may correspond to the first non-folding area NFA1, the folding area FA, and a portion of the second non-folding area NFA2, and the second display area DA2 may be the remaining portion of the second non-folding area NFA2. In such an embodiment, the size of the second display area DA2 may be less than the size of the first display area DA1.

In an embodiment, as illustrated in FIG. 12B, in a state where the folding area FA is folded, the first display area DA1 may correspond to the first non-folding area NFA1, and the second display area DA2 may correspond to the folding area FA and the second non-folding area NFA2.

FIGS. 12A and 12B illustrate an embodiment where the display device is a foldable display device F_DD. However, the disclosure is not limited thereto. In one embodiment, for example, the display device may be a rollable display device.

In embodiments of the invention, as set forth therein, a display device may drive a first display area for displaying a video and a second display area for displaying a still image at different operating frequencies. In such embodiments, the display quality of the first display area may be improved by increasing the operating frequency of the first display area, in which video is displayed, to be higher than the normal frequency. In such an embodiment, the display quality may be prevented from being degraded due to a difference between data processing speeds of the host processor for respective frames, by changing the operating frequency of the first display area.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes and modifications in form and details may be made thereto without departing from the spirit and scope of the invention as defined by the following claims.

What is claimed is:

1. A display device comprising:
   a display panel which displays an image during a plurality of driving frames;
   a panel driver which drives the display panel; and
   a driving controller which controls a driving operation of the panel driver,
   wherein the driving controller divides the display panel into a first display area and a second display area based on an image signal,
   wherein each of the plurality of driving frames includes a full frame in which the first display area and the second display area are driven, and a plurality of partial frames in each of which an entire portion of the first display area is driven and an entire of the second display area is not driven,
   wherein the first display area operates at a first operating frequency during an n-th driving frame among the plurality of driving frames and the first display area operates at a second operating frequency different from the first operating frequency during an (n+1)-th driving frame among the plurality of driving frames, wherein n is an integer greater than or equal to 1,
   wherein the n-th driving frame includes k partial frames, and the (n+1)-th driving frame includes j partial frames, k and j are integer greater than or equal to 1, and k and j have different values from each other and are determined by the first and second operating frequencies, and
   wherein the k partial frames have the same duration as each other in the n-th driving frame, and the j partial frames have the same duration as each other in the (n+1)-th driving frame.

2. The display device of claim 1, wherein
   the n-th driving frame has a first duration, and
   the (n+1)-th driving frame has a second duration,
   wherein the first duration is different from the second duration.

3. The display device of claim 2, wherein
   each duration of the k partial frames is different from each duration of the j partial frames.

4. The display device of claim 1, wherein
   a duration of each of the plurality of partial frames is shorter than a duration of the full frame.

5. The display device of claim 1, wherein the display panel includes:
   a plurality of pixels connected to a plurality of data lines and a plurality of scan lines, and
   wherein the panel driver includes:
      a data driver which drives the plurality of data lines; and
      a scan driver which drives the plurality of scan lines.

6. The display device of claim 5, wherein
   the scan driver sequentially drives the plurality of scan lines during the full frame, and
   the scan driver sequentially drives only scan lines corresponding to the first display area among the plurality of scan lines during each of the plurality of partial frames, and stops driving of scan lines corresponding to the second display area among the plurality of scan lines.

7. The display device of claim 6, wherein
   the driving controller provides a masking signal to the scan driver, and
   the scan driver stops the driving of the scan lines corresponding to the second display area in response to the masking signal.

8. The display device of claim 7, wherein
   the scan driver includes a plurality of driving stages respectively connected to the plurality of scan lines, and
   a first driving stage among the plurality of driving stages receives a start signal.

9. The display device of claim 8, wherein each of the plurality of driving stages includes:
   a driving circuit which outputs a first scan signal to a first output terminal; and
   a masking circuit which controls an output of the first scan signal to a second output terminal in response to the masking signal.

10. The display device of claim 9, wherein
the first output terminal of a j-th driving stage among the plurality of driving stages is connected to one of scan lines corresponding to pixels disposed in a j-th row among the plurality of pixels, and
wherein the second output terminal of the j-th driving stage is connected to one of scan lines corresponding to pixels disposed in a (j+1)-th row among the plurality of pixels.

11. The display device of claim 8, wherein
one of first driving stages connected to the first display area among the plurality of driving stages includes:
a first driving circuit which outputs a first scan signal to an output terminal, and
each of second driving stages connected to the second display area among the plurality of driving stages includes:
a second driving circuit which outputs a second scan signal to a first output terminal; and
a masking circuit which controls an output of the second scan signal to a second output terminal in response to the masking signal.

12. The display device of claim 8, wherein
the start signal has a first period during the full frame and has a second period during each of the plurality of partial frames, and
the second period has a size different from the size of the first period.

13. The display device of claim 12, wherein the first period is greater than the second period.

14. The display device of claim 1, wherein
the display panel operates in a first mode or a second mode,
when the display panel operates in the first mode, the driving controller divides the display panel into the first display area and the second display area based on the image signal, and
when the display panel operates in the second mode, the driving controller does not divide the display panel into the first display area and the second display area.

15. The display device of claim 14, wherein
when the display panel operates in the second mode, the display panel is driven at a normal frequency,
when the display panel operates in the first mode, the first display area is driven at an operating frequency higher than the normal frequency, and the second display area is driven at an operating frequency lower than the normal frequency.

16. The display device of claim 15, wherein an operating frequency of the first display area is changed in units of at least one driving frame.

17. The display device of claim 1, further comprising:
a frame memory including a first bank and a second bank,
wherein each of the first bank and the second bank has a size capable of storing frame data corresponding to the full frame.

18. The display device of claim 1, wherein
the driving controller provides the panel driver with a full data signal corresponding to the first display area and the second display area during the full frame, and
the driving controller provides the panel driver with a partial data signal corresponding to the first display area during each of the plurality of partial frames.

19. A display device comprising:
a display panel which displays an image;
a panel driver which drives the display panel; and
a driving controller which controls a driving operation of the panel driver,
wherein the driving controller:
divides the display panel into a first display area and a second display area based on an image signal;
provides the panel driver with a full data signal corresponding to the first display area and the second display area during a full frame; and
provides the panel driver with a partial data signal corresponding to the first display area during each of a plurality of partial frames following the full frame, and
wherein an n-th driving frame among a plurality of driving frames includes an n-th full frame and k partial frames, and an (n+1)-th driving frame among the plurality of driving frames includes an (n+1)-th full frame and j partial frames, wherein n, k, j area integers greater than or equal to 1,
wherein the first display area operates at a first operating frequency during the n-th driving frame and the first display area operates at a second operating frequency different from the first operating frequency during the (n+1)-th driving frame,
wherein k and j have different values from each other and are determined by the first and second operating frequencies, and
wherein the k partial frames have the same duration as each other in the n-th driving frame and the j partial frames have the same duration as each other in the (n+1)-th driving frame.

20. The display device of claim 19, wherein a duration of each of the plurality of partial frames is shorter than a duration of the full frame.

21. The display device of claim 19, wherein the display panel includes:
a plurality of pixels connected to a plurality of data lines and a plurality of scan lines, and
wherein the panel driver includes:
a data driver which drives the plurality of data lines; and
a scan driver which drives the plurality of scan lines.

22. The display device of claim 21, wherein
the scan driver sequentially drives the plurality of scan lines during the full frame,
the scan driver sequentially drives only scan lines corresponding to the first display area among the plurality of scan lines and stop driving of scan lines corresponding to the second display area, during each of the plurality of partial frames.

23. The display device of claim 19, wherein
the display panel operates in a first mode or a second mode,
when the display panel operates in the first mode, the driving controller divides the display panel into the first display area and the second display area based on the image signal, and
when the display panel operates in the second mode, the driving controller does not divide the display panel into the first display area and the second display area.

24. The display device of claim 23, wherein
when the display panel operates in the second mode, the display panel is driven at a normal frequency, and
when the display panel operates in the first mode, the first display area is driven at an operating frequency higher than the normal frequency, and the second display area is driven at an operating frequency lower than the normal frequency.

25. The display device of claim 24, wherein an operating frequency of the first display area is changed in units of at least one driving frame.

* * * * *